(12) United States Patent
Koshka et al.

(10) Patent No.: US 7,977,154 B2
(45) Date of Patent: Jul. 12, 2011

(54) SELF-ALIGNED METHODS BASED ON LOW-TEMPERATURE SELECTIVE EPITAXIAL GROWTH FOR FABRICATING SILICON CARBIDE DEVICES

(75) Inventors: Yaroslav Koshka, Starkville, MS (US); Galyna Melnychuk, Starkville, MS (US)

(73) Assignee: Mississippi State University, Mississippi State, MI (US)

( * ) Notice: Subject to any disclaimer, the term of this patent is extended or adjusted under 35 U.S.C. 154(b) by 748 days.

(21) Appl. No.: 11/787,144

(22) Filed: Apr. 13, 2007

(65) Prior Publication Data
US 2008/0173875 A1    Jul. 24, 2008

Related U.S. Application Data

(60) Provisional application No. 60/792,109, filed on Apr. 14, 2006.

(51) Int. Cl.
*H01L 29/15* (2006.01)
(52) U.S. Cl. ............................ 438/105; 257/E21.054

(58) Field of Classification Search .................. 257/77, 257/E21.054; 438/105, 377, 369
See application file for complete search history.

(56) References Cited

U.S. PATENT DOCUMENTS

| | | | |
|---|---|---|---|
| 5,087,433 A * | 2/1992 | Enomoto et al. | 423/346 |
| 2003/0034495 A1 * | 2/2003 | Casady et al. | 257/77 |
| 2005/0263795 A1 * | 12/2005 | Choi et al. | 257/213 |
| 2006/0211210 A1 * | 9/2006 | Bhat et al. | 438/377 |
| 2007/0145378 A1 * | 6/2007 | Agarwal et al. | 257/77 |

* cited by examiner

*Primary Examiner* — Evan Pert
*Assistant Examiner* — Selim Ahmed
(74) *Attorney, Agent, or Firm* — Lawrence Arthur Schemmel

(57) ABSTRACT

Self-aligned fabrication of silicon carbide semiconductor devices is a desirable technique enabling reduction in the number of photolithographic steps, simplified alignment of different device regions, and reduced spacing between the device regions. This invention provides a method of fabricating silicon carbide (SiC) devices utilizing low temperature selective epitaxial growth which allows avoiding degradation of many masking materials attractive for selective epitaxial growth. Another aspect of this invention is a combination of the low temperature selective epitaxial growth of SiC and self-aligned processes.

41 Claims, 21 Drawing Sheets

SELF-ALIGNED METHODS BASED ON LOW-TEMPERATURE SELECTIVE EPITAXIAL GROWTH FOR FABRICATING SILICON CARBIDE DEVICES

CROSS-REFERENCE TO RELATED APPLICATION

This application claims priority from U.S. Provisional Patent Application Ser. No. 60/792,109 filed Apr. 14, 2006. The entirety of that provisional application is incorporated herein by reference.

STATEMENT OF GOVERNMENT SUPPORT

This invention was made with U.S. Government support under contract No. N00014-04-1-0260 awarded by the Office of Naval Research. The Government may have certain rights in this invention.

BACKGROUND OF THE INVENTION

1. Field of the Invention

This invention relates to a method of fabricating silicon carbide (SiC) devices utilizing a combination of selective epitaxial growth of SiC and self-aligned processes. Further, it relates to designs of SiC devices enabled by the fabrication method.

2. Background of the Technology

Self-aligned processes are used in the semiconductor industry to obtain desirable alignment and spacing of the device regions and features and to optimize operating characteristics of the devices. Self-alignment fabrication allows device regions to automatically align due to control of the processing sequence and parameters during the manufacturing process rather than to align by manual alignment.

Self-aligned fabrication of silicon carbide (SiC) devices is a desirable technique, which could enable reduction in the number of photolithographic steps, simplified alignment of different device regions, and reduced spacing between the device regions.

Prior to this invention, self-aligned fabrication of silicon carbide (SiC) devices has been at various stages of development. Techniques based on more conventional ion implantation (rather than selective growth) were predominantly attempted. Difficulties in growing epitaxial SiC selectively in mask openings by selective epitaxial growth (SEG) are in part responsible for the slow progress in SiC self-aligned fabrication. It has been desirable to fabricate SiC semiconductor devices in a self-aligned manner by using SEG under low temperature selective epitaxial growth conditions. However, until recently, it has been impossible to conduct SEG at sufficiently low temperatures (e.g., below 1400° C. or even 1300° C.). This is the reason that self-aligned techniques based on low-temperature selective epitaxial growth (i.e., the subject of the present invention) have not been proposed.

Selective epitaxial growth for SiC devices using standard epitaxial techniques was proposed in U.S. Pat. No. 6,767,783 (hereinafter the '783 patent). However, the performance of the proposed designs and a variety of innovative improvements to the designs of the '783 patent were limited by the low efficiency and low flexibility of existing selective epitaxial growth technologies. Limiting conditions included difficulty in avoiding nucleation on the surface of the mask, lateral growth above thin masks, mask degradation at high temperatures of the epitaxial growth, complexity to remove the mask after use, as well as others. As a result, most of the proposed designs and fabrication techniques only partially used SEG and were quasi-self-aligned and not truly self-aligned. Additionally, the epitaxial re-growth in the prior art was intended to take place in trenches etched in the SiC material itself; unintended growth also takes place on other SiC surfaces, which does not allow separation (i.e., electrical isolation) of different device regions without significant process complication. In this respect, the present invention is differentiated from the '783 patent since the present invention utilizes previously non-existent methods—SEG conducted at low temperatures (i.e., low-temperature SEG), including temperatures consistent with low-temperature-tolerant masking materials including but not limited to $SiO_2$ and $Si_3N_4$.

Selective epitaxial growth for SiC devices using the standard regular-temperature epitaxial techniques was proposed in Li et al., "Selective Growth of 4H—SiC on 4H—SiC Substrates Using a High-Temperature Mask", Materials Science Forum, v 457-460, pp. 185-188 (2004) and U.S. Patent Application No. 20060211210, Bhat et al. The problem of mask degradation under such temperatures may possibly be overcome in these references by using a high temperature mask made of tantalum carbide (TaC). While a broader temperature range (including lower temperatures) is contemplated, no disclosure exists of how a growth at temperatures lower than standard (i.e., above 1450° C.) could be conducted. The novelty of those disclosures is only in using a different masking material, not in suggesting novel ways of achieving previously impossible goals—low-temperature selective epitaxial growth. In this respect, the present invention is differentiated from the disclosures by Li et al. and Bhat et al. since the present invention utilizes previously non-existent methods—SEG conducted at low temperatures (i.e., low-temperature SEG), including temperatures consistent with low-temperature-tolerant masking materials including $SiO_2$ and $Si_3N_4$.

An epitaxial regrowth-based fabrication technology and BJT design to provide a very narrow base region was proposed in U.S. Pat. No. 6,815,304 (hereinafter the '304 patent). That technique does not use selective epitaxial growth but instead is based on epitaxial overgrowth in trenches. It enables epitaxial growth of a theoretically unlimitedly-thin intrinsic base layer. However, the proposed design of the '304 patent suffers from a large area of contact between the emitter of the bipolar junction transistor and the heavily-doped extrinsic base. This is one major design limitation leading to low injection efficiency due to a high level recombination of minority carriers injected from the emitter to extrinsic base, an injection of minority carriers into the emitter, and a high base current with low transistor gain. In addition, a problem exists concerning the quality of the contact between the extrinsic base and the intrinsic base layer since the contact is formed at the merging sidewalls of the two epitaxial layers. This issue can contribute to the increase of the lateral resistance of the base. In this respect alone, the present invention is distinguished from the '304 patent since the present invention utilizes previously non-existent methods—SEG conducted at low temperatures, including temperatures consistent with low-temperature masking materials such as $SiO_2$ and $Si_3N_4$ and does not depend on overgrowth in trenches conducted under conventional growth conditions.

One of the first truly self-aligned fabrication processes for silicon carbide devices was proposed in U.S. Provisional Application No. 60/552,398. That disclosure did not involve selective epitaxial growth of SiC and the self-aligned portion of the fabrication sequence was limited to self-aligned formation of metal silicides and metal layers. A self-aligned LDMOS transistor was proposed in U.S. Pat. No. 5,348,895.

However, that disclosure does not use SEG techniques and is distinguished from the present invention. U.S. Pat. No. 6,653,659 (hereinafter the '659 patent) mentions a possibility of using selective epitaxial deposition. However, the '659 patent does not disclose the possibility of using SEG for self-aligned fabrication. Likewise, the '659 patent is distinguished from the present invention.

A method of using epitaxial regrowth for self-aligned fabrication of SiC devices was proposed in U.S. Pat. No. 6,982,440 (hereinafter the '440 patent). The '440 patent primarily claims growth of SiC on patterned SiC substrates and not SEG, making it fundamentally different from the present invention. Also, the '440 patent claims the possibility of conducting the regrowth step on selected portions of a device. However, it does not disclose a method for conducting this regrowth selectively. In this respect alone, the present invention is differentiated from the '440 patent since the present invention utilizes among other differences previously non-existent methods of SEG conducted at low temperatures.

There has been a long-recognized need for an "operational" low-temperature selective epitaxial growth technique for SiC. Multiple research-level efforts to develop a selective epitaxial growth technique that would work for SiC at conventional (high) growth temperatures, such as that disclosed in Chen et al., "Selective Embedded Growth of 4H—SiC Trenches in 4H—SiC (0001) Substrates Using Carbon Mask", Jpn. J. Appl. Phys., Vol. 44, No. 7A, pp. 4909-4910 (2005), confirm clear recognition of such a need. However, prior to the present invention, multiple problems (which will be described herein) were responsible for the unavailability of working SEG growth technology and, consequently, for the unavailability of the self-aligned fabrication process based on SEG. Successful development of SEG and self-aligned techniques for SiC have not been possible, until the present invention, by the high temperatures required for epitaxial growth of SiC.

It had been long believed prior to the present invention that growth of monocrystalline silicon carbide of sufficiently good quality for microelectronics applications (including 4H and 6H polytypes) was impossible at temperatures below 1450-1500° C. The first report of the method allowing epitaxial growth at lower temperatures (below 1300° C.) is described in the previous disclosure U.S. patent application Ser. No. 11/521,869, Publication No. 2007/0062441 (Mar. 22, 2007), Provisional Application No. 60/717,695, filed Sep. 16, 2005, Y. Koshka.

The present invention discloses new self-aligned fabrication processes for different SiC devices. The methods use low-temperature epitaxial growth developed for SiC homoepitaxy on SiC substrates. The present invention uses epitaxy conducted at temperatures sufficiently low to prevent mask degradation during SEG.

Prior to the present invention of the low-temperature growth methods for SiC, various disclosures claimed growth of a wide range of materials at lower temperatures. For example, U.S. Pat. No. 5,595,600 claimed low-temperature selective growth of silicon and silicon alloys (including growth on SiC substrates). However, a method to grow silicon and silicon alloys, even when conducted on an SiC substrate, is inapplicable to epitaxial growth of SiC. The low-temperature growth of SiC on SiC substrates has not been possible before and has not been demonstrated prior to the present invention.

Some of the basic steps applied traditionally in SEG of semiconductor device regions are incorporated in the new methods of the present invention. However, one of the main novelties of the present invention is the fact that its low-temperature epitaxy enables use of masking materials that cannot be used at regular temperatures of previous SiC homoepitaxial growth techniques.

Successful low-temperature SEG of 4H—SiC with $SiO_2$ mask has been demonstrated (FIG. 1A). The process allows selective epitaxial growth in the window openings formed in an almost arbitrary thick masking layer, enabling formation of vertical walls of the active device regions and shaping of almost arbitrary thick device regions. At the growth temperatures used for low-temperature SEG, there is absolutely no nucleation of SiC on the top of the mask and no degradation of the SiC surface under the mask. After the selective growth of the given region of the device is completed, the masking material and the newly formed SEG regions of SiC are ideally suitable for a self-aligned formation of the next device region without the need for defining topology with the use of photolithography.

The current invention involves self-aligned processes based on low-temperature SEG for a variety of SiC devices that can benefit from the new methods. The self-aligned structures can be used to optimize the performance of the diodes, vertical transistors, or thyristors in SiC. Self-aligned structures according to the present invention can allow for lower manufacturing costs, lower gate resistance, lower gate-to-source and gate-to-drain capacitances, and increased speed and efficiency.

SUMMARY OF THE INVENTION

A selective epitaxial growth (SEG) process conducted at temperatures sufficiently low to prevent mask degradation during growth enables improved designs and fabrication processes for SiC device topologies. It also enables fabrication processes using a truly self-aligned approach. Device regions of desirable thickness are formed by selectively growing SiC in window openings etched in the masking layer having thickness close to or exceeding the targeted thickness of the device region. Alternatively, the thickness of the masking layer can be lower than the targeted thickness of the device region, in which case a lateral epitaxial growth above the mask will be allowed. Mesa p-n junctions are formed by growing SiC regions of the opposite conductivity sequentially in the same window opening. Graded doping changing with mesa thickness can be achieved by changing doping during the SEG process when growing in the mask window openings.

In order to apply low-temperature SEG to form a new part or parts of a semiconductor device that are self-aligned to the previously-formed device region without sharing the sidewalls or being in electrical contact with the previously-formed device regions, the sidewalls or the top surfaces, or both, of the previously-formed device region are protected with the mask prior to conducting the next low-temperature SEG step. In addition, it may be necessary that the device regions formed at different stages of the fabrication process are in contact with each other. This may require formation of portions of SiC regions below the masking layer.

Self-aligned formation of the mask for SEG can be accomplished by employing combinations of more than one masking layer made of the same or different masking materials and used at different stages of the fabrication process.

Not only SEG regions but a metal layer (or metal silicide, or any other layer) can be self-aligned to the previously-formed SEG mesas or mesas formed by techniques other than SEG. In this case, a metal layer is deposited prior to removing the previous SEG masking layer. The metal layer will be lifted-off by selectively etching the previous SEG masking layer, with the metal remaining on the top of the SEG mesas.

Alternatively, not lift-off of the metal but formation of the self-aligned silicide (salicide) can be conducted using the same technique. Salicide formation by annealing will be conducted prior to removing the previous SEG mask. Salicide does not form on the mask, and the deposited metal can be removed from the masking material with salicide remaining on the top of the SEG mesas self-aligned to the mesa dimensions.

To perform low-temperature SEG growth of device regions self-aligned to the previously formed mesas (the previously formed mesas could have been formed also by SEG or any other technique) without making new SEG regions contact the previously-formed mesas, not only the top but also the sidewalls of the previous SEG mesas are covered with the masking material. The thickness of the masking material on the sidewalls (so-called spacer) is used to precisely define the distance between the different device regions (mesas).

SEG regions, metal layers, silicides, etc. can be self-aligned to other mesas previously formed by techniques other than SEG. For example, SEG regions formed by low-temperature SEG can be self-aligned to mesas formed by etching in the previous fabrication steps.

Some types of SiC devices encompassed by this invention require SEG of the next device region in contact with the sidewalls of the previously-formed mesas but not in contact with the tops of the previously-formed mesas. The approach described above can be used with a single modification—omission of the step leading to the formation of the sidewall spacer (i.e., masking material covering the walls of the previously-formed mesas).

Another component and advantage of the invention involves self-aligned formation of the device regions based on allowing lateral epitaxial growth above the mask after the mesa thickness exceeds the thickness of the masking layer. This SEG with lateral growth component may take place on the horizontal walls as well as on the sidewalls, whereby growth on the sidewalls means that the lateral growth may proceed in a vertical direction. SiC material that grows laterally forms additional sidewalls that can be used to form a spacer or spacers separating the SEG regions from the top surfaces of the previously-formed mesas. The spacer can be used to provide self-aligned silicide (i.e., salicide) to different SiC surfaces of the device and different device regions separated by a spacer or spacers. The spacer can also be used to provide self-aligned final metal to different SiC surfaces of the device and different device regions separated by the spacer or spacers. The spacer can likewise be used as a mask or part of a mask for the subsequent SEG steps.

An additional component and advantage of the present invention involves doping of the mesas produced by SEG using so-called "autodoping." The doping is done by release of dopants from an intentionally-doped SEG mask and incorporation of the released dopants in the mesas during SEG. This technique allows a preferential doping of the portions of the mesas close to the mesa walls (i.e., close to the mask). While autodoping is not a new phenomenon, its use for SiC applications and for SEG of SiC, in particular, is novel.

With the foregoing and other objects, features, and advantages of the present invention that will become apparent hereinafter, the nature of the invention may be more clearly understood by reference to the following detailed description of the preferred embodiments of the invention and to the appended claims.

BRIEF DESCRIPTION OF THE DRAWINGS

These drawings accompany the detailed description of the invention and are intended to illustrate further the invention and its advantages.

DETAILED DESCRIPTION OF THE INVENTION

Selective epitaxial growth (SEG) processes involve selectively growing a semiconductor material on an exposed surface of a substrate utilizing at least one mask having one or more window openings. The mask is chosen to ensure that growth occurs on the semiconductor surface (i.e., on the substrate). The growth conditions are selected so that growth or deposition of the semiconductor material does not occur on the mask. The high temperatures used in typical growth processes may degrade the mask and/or require mask removal, resulting in preclusion of use of the mask for subsequent self-alignment processes. The present invention provides methods for fabricating silicon carbide semiconductor devices utilizing selective epitaxial growth at low temperatures which preserve the mask and allow use in self-alignment processes.

A selective epitaxial growth (SEG) process conducted at temperatures sufficiently low to prevent mask degradation during growth (i.e., a low-temperature SEG process) enables designs of SiC device topologies and fabrication processes using a truly self-aligned approach. These designs and fabrication processes have not been proposed earlier because previously-available SEG techniques for silicon carbide did not allow their implementation. However, while the preferred embodiments of the present invention have been demonstrated using halo-carbon low-temperature epitaxial growth technique (the method described in the previous disclosure U.S. patent application Ser. No. 11/521,869, Publication No. 2007/0062441 (Mar. 22, 2007), Provisional Application No.

60/717,695, filed Sep. 16, 2005, Y. Koshka), the novel methods of the present invention for device fabrication and the various embodiments of the invention can be implemented by other SEG processes allowing similar process functionality.

Figure 1A:
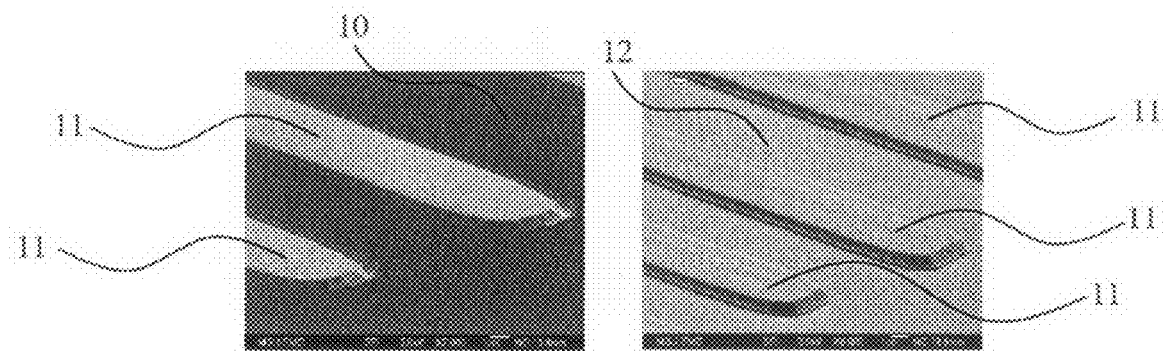
FIG. 1A shows experimental results of successful low-temperature selective epitaxial growth experiments.

The feasibility of low-temperature SEG has been demonstrated (FIG. 1A). More than 1 μm-thick SEG mesas 11 having lateral dimensions of a few microns have been grown on 4H—SiC substrate 12 with defect-free morphology when applying halo-carbon low-temperature epitaxial growth technique to conduct SEG with 1 μm-thick $SiO_2$ mask 10. Previously, $SiO_2$, silicon nitride, and other masking materials used in silicon (Si) epitaxy were not suitable for epitaxial growth of 4H—SiC, 6H—SiC, and other polytypes requiring high temperature growth. However, no mask degradation took place at 1300° C. used in this experiment (FIG. 1A left).

No less important is that excellent growth selectivity has been demonstrated by the present invention. Absolutely no deposition took place on the mask 10 (FIG. 1A left). All growth took place in the mask window openings. Consequently, low-temperature SEG techniques overcome the limitations of traditional SEG of SiC using high temperature masks. The present invention demonstrates that the $SiO_2$ mask can be removed quickly and easily, leaving SiC mesas 11 on SiC substrate 12 (FIG. 1A right).

Figure 1B:
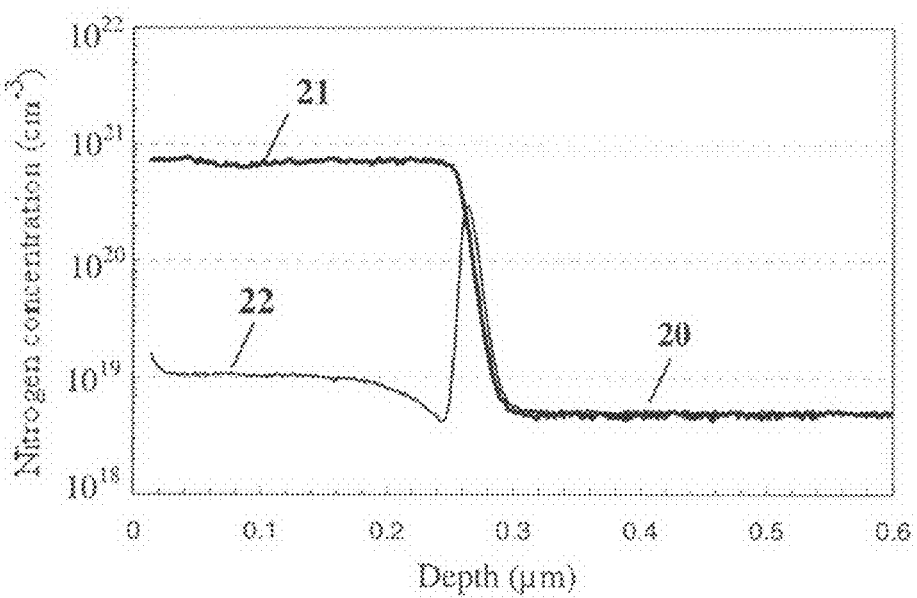
FIG. 1B shows experimental results of heavily-doped epitaxial layers that were achieved by insitu doping with nitrogen during low-temperature epitaxial growth at 1300° C. These results validate the use of low-temperature epitaxial growth (including low-temperature SEG) for ohmic contact formation.

In addition, another group of experimental results supports the feasibility of forming ohmic contacts using low-temperature epitaxial growth (including but not limited to SEG). Heavily-doped epitaxial layers were achieved by insitu doping with nitrogen during low-temperature epitaxial growth at 1300° C. (FIG. 1B). While the doping of the substrate 20 does not exceed $5\times10^{18}$ $cm^3$, the doping of the epitaxial layers grown on the carbon (C) face of the SiC substrate 21 and the silicon (Si) face of the SiC substrate 22 is close to $7\times10^{20}$ $cm^{-3}$ and $1\times10^{19}$ $cm^3$, respectively. This high doping achieved by low-temperature epitaxial growth enables the novel technique of forming ohmic contacts by growing highly-doped layers of SiC using low-temperature epitaxial growth (including but not limited to SEG) prior to metal deposition.

Figure 2A:
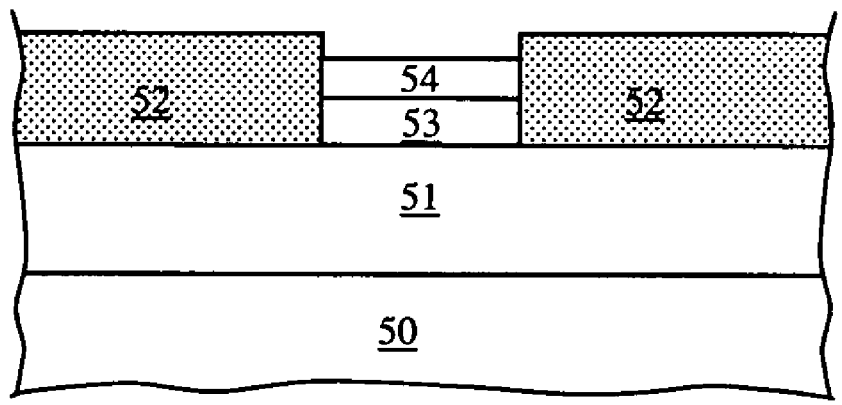
FIGS. 2A-2C depict the critical steps for the design and fabrication process of a SiC p-n junction diode.

FIG. 2A can be used to illustrate the present invention. The main steps of the novel selective epitaxial growth (SEG) techniques of the present invention include formation of a selective epitaxial growth SEG mask 52 on the surface of a SiC substrate 50 or on the surface of the optional drift region 51, forming at least one window opening in the SEG mask to expose the surface of the SiC substrate, and forming at least one SEG mesa 53 in at least one window opening of the SEG mask and disposed on the SiC substrate by SEG conducted at temperatures sufficiently low to prevent mask degradation during growth.

The term "SEG mesa" (or an equivalent term referring to a mesa formed by the SEG method) that is disposed on a surface of a substrate as used herein means a region of a predetermined shape and dimension (lateral and vertical) produced by selective epitaxial growth on the exposed surface of the substrate. As described further, the SEG growth can be conducted on a planar surface of the substrate or in a trench formed in the substrate. If a trench in the substrate is not used, the SEG mesa would appear as a protrusion above the surface of the substrate on which it is formed. If the mesa is formed by filling a trench in the substrate using the SEG method, this shape may be allowed to protrude above the surface of the substrate (i.e., by entirely filling the trench and extending beyond the trench) or it may not protrude above the surface (i.e., due to only partial filling of the trench) depending upon a particular embodiment.

The SiC substrate on which the growth takes place can be any structure with the surface represented with a SiC layer on which SEG is conducted. Possible examples of SiC substrate include, but are not limited to: (1) a SiC wafer; (2) a substrate made of another material with a SiC layer on the top; (3) a stack of a few different SiC layers, with the SEG process conducted on the top layer; and (4) a structure having a non-planar SiC surface (e.g., a surface having other SiC mesas and/or indentations (trenches)).

Mesa p-n junctions are formed by growing different SiC layers of SEG mesas having the opposite conductivity sequentially in the same window opening. This is illustrated in FIG. 2A showing the first SiC layer 53 and the second SiC layer 54 grown by SEG in the same window opening in the SEG mask 52 formed on the surface of SiC substrate having the top layer 51 on which the growth takes place. Graded doping changing with mesa thickness can be achieved by changing doping during the SEG process when growing in the mask window openings.

SiC mesa or mesas formed by SEG can have a single SiC of a desirable conductivity. By changing doping during low-temperature SEG, it is possible to obtain a single SiC layer with conductivity changing with depth, or multiple SiC layers of different conductivity.

Alternatively, multiple SiC layers can be formed in different growth runs by taking the sample from the reactor after each run.

Silicon dioxide ($SiO_2$) is the preferred material for the SEG mask in the preferred embodiment of the invention. Temperatures of 1300° C. and short growth times of below 15 minutes are used in the preferred embodiment of the invention to ensure negligible mask degradation. High growth rates of the SEG process enable achieving thicknesses of the SEG mesas in excess of 5 microns while using short growth times of below 15 minutes. Use of various halo-carbon growth precursors and the addition of various halogenated gases allow additional increase of the growth rate.

Other masking materials such as silicon nitride and aluminum nitride, are even more suitable for use as SEG masks due to their higher thermal stability than $SiO_2$. Temperatures in the range of 1300° C. to 1400° C. may be used for other masking materials while preserving SEG mask stability. High-temperature masking materials such as graphite, carbon, polycrystalline silicon, and tantalum carbide can also be used, while the novel method of the present invention of conducting SEG at reduced temperatures simplifies process control.

A combination of masking layers is also possible, such as utilizing a thicker masking layer defining the topology and a thin layer of another masking material providing the masking surface with different properties. Additionally, the second (and third, and fourth, etc.) masking layers can be used to enable self-aligned formation of the SEG mask for the subsequent SEG steps.

The SEG process conducted at temperatures sufficiently low to prevent mask degradation during growth enables designs of SiC device topologies and fabrication processes using a truly self-aligned approach. Device regions of desirable thickness are formed by selectively growing SiC mesas in the window openings etched in the SEG masking layer having thickness close to or exceeding the targeted thickness of the device region. For example, an $SiO_2$ layer having a thickness of 2 microns can be used to provide SEG mesas having thickness of up to 2 microns.

Alternatively, the thickness of the masking layer can be lower than the targeted thickness of the device region, in which case a lateral epitaxial growth above the mask will be allowed. While the basic selective epitaxial growth described in the present invention proceeds in a direction perpendicular to the surface of the SiC substrate on which the growth takes place, the lateral epitaxial growth takes place when the thickness of the growing mesa exceeds the thickness of the SEG mask, and the growth continues not only perpendicular to the surface of the SiC substrate but also laterally (i.e., in a direction parallel to the surface of the SiC substrate). For example, when the mask is 1 micron thick, SEG will not have the lateral epitaxial growth component until the mesa height is less than 1 micron thick. When the mesa height exceeds 1 micron, the lateral growth component appears, thus making the mesa grow above the top surface of the SEG mask and become larger in both vertical and lateral (horizontal) directions.

Figure 3A:
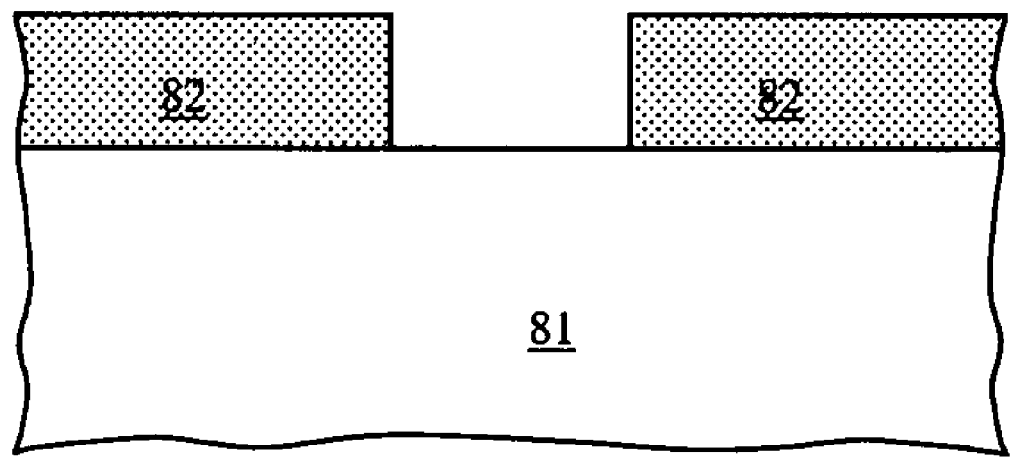
FIGS. 3A-3B depict an additional optional step of the selective epitaxial growth involving growth in trenches formed on the surface of a SiC substrate.
Figure 3B:
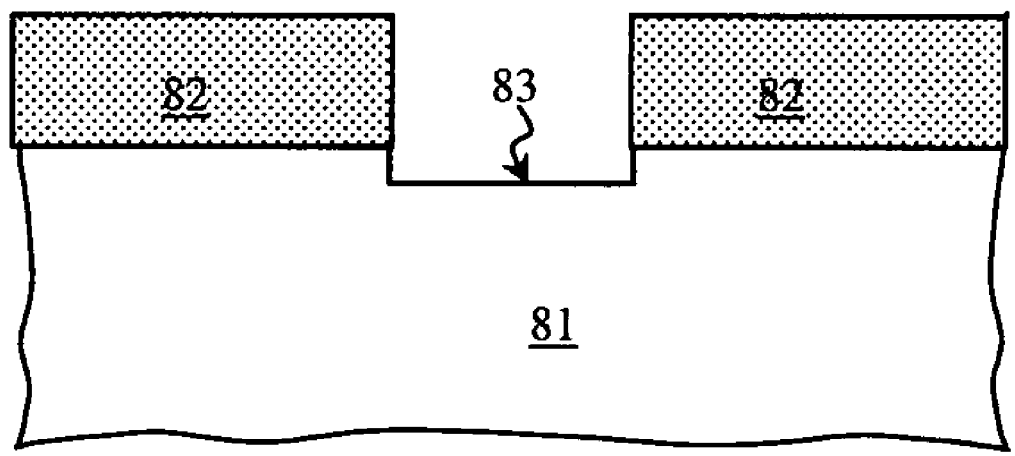

Another embodiment of the invention includes an additional step after forming the window openings in the SEG mask but prior to conducting selective epitaxial growth as shown, in FIGS. 3A-3B. In this embodiment, after removing the material of the SEG mask 82 to form at least one window opening in the SEG mask exposing the surface of the SiC substrate 81 (FIG. 3A), the SiC material of the SiC substrate is also removed down to a desirable depth to form at least one trench 83 (FIG. 3B) in the SiC substrate. The desirable depth is determined by the particular device application (i.e., device design considerations dictating how deep a particular device region—formed by SEG—should penetrate in the depth of the layer on which the device region is formed). For example, a depth of 0.5-1.0 microns can be a desirable depth for SEG regions serving as edge termination regions or for SEG regions serving as portions of merged p-n/Schottky junction diodes. Next, the SEG in the window opening is conducted as described above, but the selective epitaxial growth process first fills the trench 83 with SiC, with the formation of the SEG mesa occurring only thereafter.

Concerning the mesa edge termination region, the proposed technique is suitable for many possible edge termination designs including, but not limited to, junction termination extensions (JTEs), guard rings structures, etc.

In order to apply low-temperature SEG to form a new part or parts of a semiconductor device that are self-aligned to the previously-formed device regions without sharing the sidewalls or being in electrical contact with the previously-formed device regions, the sidewalls or the top surfaces, or both, of the previously-formed device regions are covered with the SEG mask prior to conducting the next SEG step. This can be illustrated with the help of FIG. 11G, where a sidewall spacer (emitter-sidewall spacers 407 in FIG. 11G) covers the sidewalls of the previously formed device region (emitter mesas 405 in FIG. 11G) and a SEG mask placed on top of the other mesa (base-contact-region-SEG mask 406 in FIG. 11G) covers the top surface of the previously formed device region (emitter mesas 405 in FIG. 11G). A sidewall spacer or spacers (including sidewall spacers formed by any of the conventional techniques used in microelectronics fabrication) can be used as such SEG mask. In addition, it may be necessary that the device regions formed at different stages of the fabrication process are in contact with each other. This is accomplished by forming portions of SiC regions below the SEG masking layer. Alternatively, it is possible to have sidewalls of certain mesa regions contacting each other while having the top surfaces of the mesas protected with masks.

Also, the present invention provides methods to form device regions by SEG by making semiconductor regions (on which SEG is to be conducted) free from the mask at arbitrary locations of the substrate and at any distance and location in respect to the previously-formed regions of the device. One such method is through defining size and position of the regions not to be covered by the mask using photolithography.

Self-aligned formation of the mask for SEG can be accomplished by employing combinations of more than one masking layer made of the same or different masking materials and used at different stages of the fabrication process. The second (usually thinner) SEG masking layer is formed on top of the first SEG masking layer after the window openings for low-temperature SEG are formed in the first mask. The second SEG masking layer is used to prohibit low-temperature SEG from occurring in some of the window openings selected for this purpose, while allowing growth in the other window openings. For that to occur, anisotropic etching of the second SEG masking layer will expose the SiC surface in those window openings where the growth is desired, while other window openings will be protected from the etching by photoresist, for example. Then at least one SEG mesa is formed on the exposed surface of the SiC substrate in selected window openings by selective epitaxial growth. Subsequently, anisotropic etching of the second SEG masking layer exposes the SiC surface in the previously-covered window openings, making them suitable for the growth of at least one additional SEG mesa. As a result, the at least one additional SEG mesa is automatically aligned with respect to the at least one SEG mesa (i.e., with respect to the SEG mesa formed in the first low-temperature SEG step).

Figure 11A:
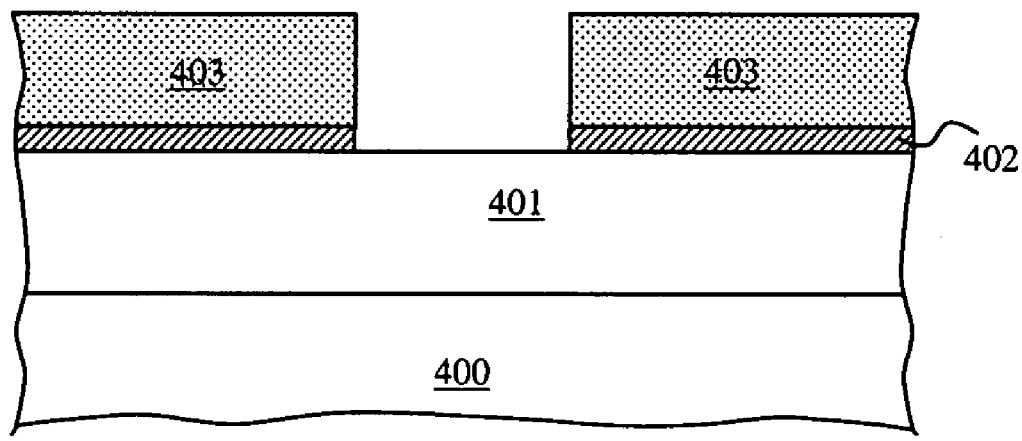
FIG. 11 depicts the critical steps for the design and fabrication process of a SiC bipolar junction transistor.
Figure 11B:
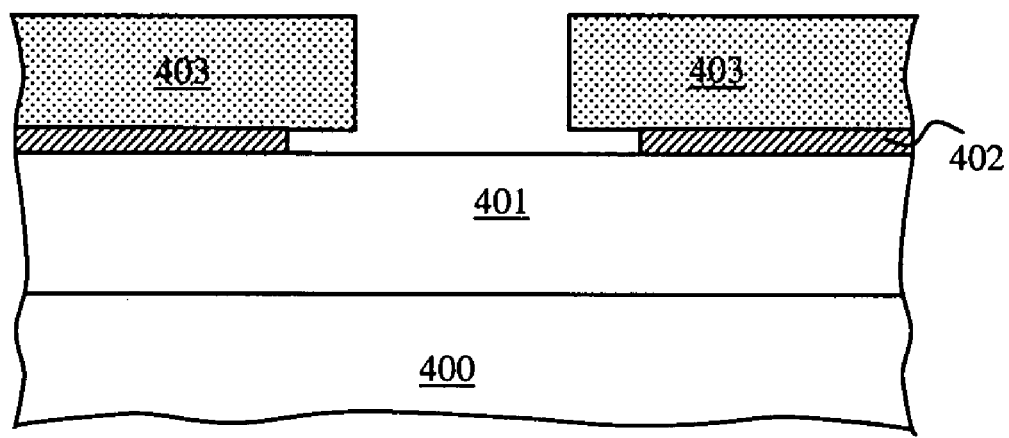
Figure 11C:
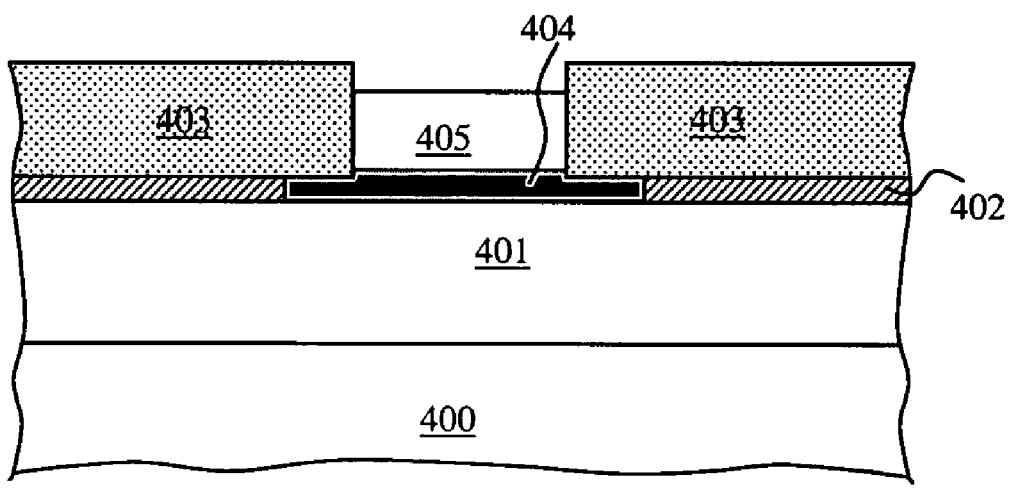

Another embodiment can be illustrated with the help of FIGS. 11A-11C. An additional (normally thinner) SEG masking layer 402 may be formed below the main SEG masking layer 403, and the SEG window openings are formed through both layers. Subsequently, selective under-etching of a portion of the additional SEG masking layer below the main SEG masking layer without etching the main masking layer is conducted. This under-etching space enables low-temperature SEG to occur not only in the window opening but also under the main SEG masking layer 403 at the window opening periphery, which can be used to provide contact of a portion of the low-temperature SEG device region (region 404 in FIG. 11C) grown under the main SEG masking layer 403 with other device regions to be formed during one of the subsequent low-temperature SEG steps.

Deposition of another (normally thinner) masking layer (a second masking layer) prior to removing the previous (usually thicker) SEG masking layer (a first SEG mask) is used to form a second SEG mask placed on top of the previously-formed SEG mesa for the next low-temperature SEG step. This second SEG mask is self-aligned to the dimensions of the existing SEG mesas which means that, without employing additional photolithographic steps, the second masking layer is formed to cover the tops of the previously-formed SEG mesas by, for example, performing lift-off of the second masking layer by selectively etching the first SEG mask. As a result, the second masking layer will be removed everywhere but from the top of the SEG mesas and will be ready to be used as the SEG mask for the next SEG step.

A similar approach can be used when it is not a next SEG region to be self-aligned but a at least one contact that is to be self-aligned to the previously-formed SEG mesas or mesas formed by techniques other than SEG. Such certain contact region can be a metal layer, a metal silicide, or any other layer.

In one preferred embodiment, the at least one contact is formed as follows. At least one metal layer is deposited prior to removing the SEG mask that was used for previously-performed SEG. The at least one metal layer may comprise a plurality of layers made of different metals depending on the requirements to metal contact and its integration with other layers. A portion of the SEG mask is used as a mask for defining the dimensions of the metal layer. In the preferred embodiment, the metal layer is lifted-off by selectively etching the SEG mask, with the metal remaining on the top of the SEG mesas.

Alternatively, not lift-off of the metal but formation of the self-aligned silicide (salicide) can be conducted using the same technique. Silicide formation by annealing will be conducted prior to removing the previous SEG mask ($SiO_2$ mask in the preferred embodiment). The SEG mask serves as a mask for salicide formation. Silicide does not form on the SEG mask. After salicide formation, the deposited metal is removed from the SEG mask and, as a result, the silicide formed on the top of the SEG mesas is self-aligned to the mesa dimensions.

To perform SEG of device regions (SEG mesas) self-aligned to the previously-formed mesas (the previously-formed mesas can be formed by SEG or any other technique) without making new SEG regions contact the previously-formed mesas, not only the top but also the sidewalls of the previous SEG mesas are covered with the SEG mask. This can be illustrated with the help of FIG. 11G, where a sidewall spacer (emitter-sidewall spacers 407 in FIG. 11G) covers the sidewalls of the previously formed device region (emitter mesas 405 in FIG. 11G). The thickness of the SEG mask on the sidewalls (so-called sidewall spacer) is used to precisely define the distance between the different device regions (mesas). In the preferred embodiment of the invention, formation of the masking layer on the sidewalls (sidewall spacer) is done by performing blanket deposition of a masking layer (e.g., $SiO_2$) of desirable thickness. The masking layer will cover the entire surface of the substrate including the horizontal surfaces (including the tops of the previously-formed mesas) and sidewalls of the mesas. Anisotropic etching will expose the horizontal surfaces on which the SEG growth is to be conducted. The sidewalls will remain covered with the remaining portion of the masking layer (i.e., sidewall spacer). The tops of the previously-formed mesas will still be protected by the masking layer formed in the previous step, as described above.

SEG regions, metal layers, silicides, etc. can be self-aligned to other mesas previously formed by techniques other than SEG. For example, SEG mesas can be self-aligned to at least one other mesa formed by etching in the previous fabrication steps ("other mesas"). In a preferred embodiment of the invention, a mask that is used for etching the other mesas (i.e., etch mask) forms an SEG mask placed on top of the other at least one other mesa. This SEG mask is subsequently used for the subsequent SEG step. This can be illustrated with the help of FIG. 9C, where the gate-SEG mask 304 can be used as an etch mask to form the at least one other mesa (the channel mesas 303) by etching. Thereby the etch mask (the gate-SEG mask 304 in FIG. 9C) serves as the SEG mask placed on top of the at least one other mesa.

Some types of SiC devices covered by the present invention require SEG of the next device region in contact with the sidewalls of the previously-formed mesas but not in contact with the tops of the previously-formed mesas. The combination of approaches described above can be used to accomplish such a result, with one modification—omission of the step leading to the formation of the sidewall spacer (i.e., masking material covering the walls of the previously-formed mesas). This can be illustrated with the help of FIG. 9D, where the at least one SEG mesa (gate regions 305) is aligned to at least one other mesa (the channel mesas 303) by conducting selective epitaxial growth of the SEG mesa using the SEG mask placed on top of the other mesa (gate-SEG masking layer 304) to prohibit growth on the top of the other mesa (gate-SEG masking layer 304) during selective epitaxial growth of the SEG mesa (gate regions 305).

Another embodiment of the invention involves self-aligned formation of the device regions based on allowing lateral epitaxial growth above the mask after the mesa thickness exceeds the thickness of the masking layer. Lateral epitaxial growth has been defined hereinabove. The selective epitaxial growth having a lateral growth component may take place on the horizontal walls as well as on the sidewalls of the SiC substrate. In the case of the sidewalls, lateral growth may proceed in a vertical direction (parallel to the vertical growth surface). SiC material, that grows laterally, forms at least one additional mesa sidewall that can be used to form a sidewall spacer or spacers separating the SEG regions from the top surfaces of the previously-formed mesas. The sidewall spacer can be used to provide self-aligned silicide (i.e., salicide) to different SiC surfaces of the device and different device regions separated by the spacer or spacers. The spacer can be also used to provide self-aligned final metal to different SiC surfaces of the device and different device regions separated by the spacer or spacers. The spacer or spacers can also be used as a mask or a portion of a mask for the subsequent SEG steps.

In another embodiment of the invention, the spacer on the sidewalls of the laterally-growing SEG region can be formed on a portion of the SEG mask itself by performing anisotropic etching of the SEG mask. In this case, a portion of the SEG mask covered by the laterally-grown SEG region will remain serving as a spacer, without the need in additional masking layer formation to produce a spacer.

Another embodiment of the invention involves doping of the mesas produced by SEG using so-called "autodoping." The doping is accomplished by release of dopant species from an intentionally-doped SEG mask and incorporation of the released dopant species in the SEG mesas during SEG. This technique allows a preferential doping of portions of the mesas close to the mesa sidewalls (i.e., close to the mask). The dopant species could be, for example, nitrogen (to provide n-type), or aluminum and boron (to provide p-type). While autodoping is not a new phenomenon, its use for SiC applications and for SEG of SiC, in particular, is novel.

A further embodiment of the invention involves forming ohmic contact regions using low-temperature SEG of a highly-doped epitaxial layer (to reduce contact resistance), while protecting other regions of the wafer where the contact should not be formed with a mask. This embodiment includes forming at least one ohmic contact on the back of the wafer using low-temperature epitaxial growth of a heavily-doped epitaxial layer, while protecting the entire front side of the wafer with the mask. For SiC, highly-doped SiC layers are those having doping in excess of about $10^{18}$ $cm^{-3}$ (and preferably in excess of $10^{19}$-$10^{20}$ $cm^{-3}$).

Figure 2B:
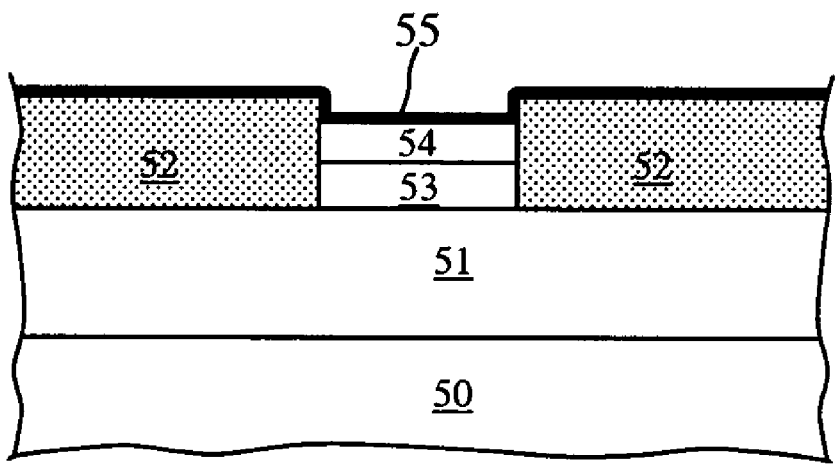
Figure 2C:
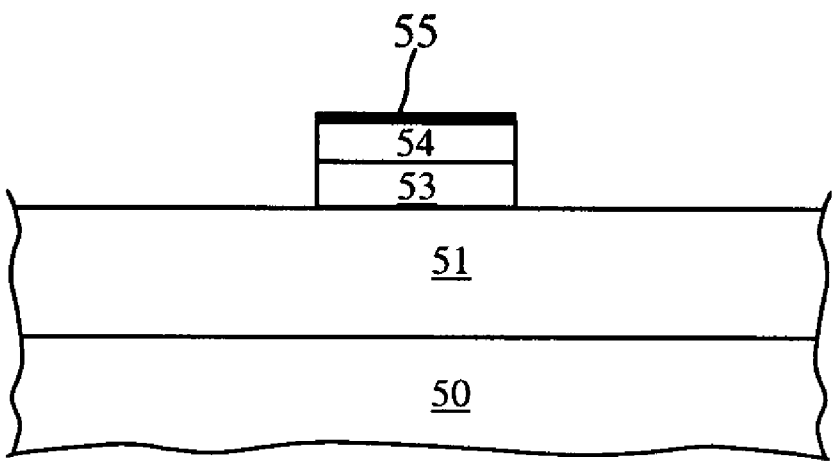

The demonstrated experimental results, as shown in FIG. 1A, support implementing a simple and reliable design of a SiC p-n junction diode shown in FIGS. 2A-2C. According to a first embodiment of the invention, the optional drift region 51 is formed on the surface of the SiC substrate 50 (FIG. 2A). The drift region 51 can be a low or moderately doped epitaxial layer grown on the surface of the SiC substrate using regular-temperature epitaxial growth or low-temperature epitaxial growth (LTEG) (the latter method is described in the previous disclosure U.S. patent application Ser. No. 11/521,869, Publication No. 2007/0062441 (Mar. 22, 2007), Provisional Application No. 60/717,695, filed Sep. 16, 2005, Y. Koshka).

A masking layer 52 is formed on the top of drift region 51 if the drift region 51 is present or on the surface of the SiC substrate if the drift region is not present. Openings (window openings) in the masking layer 52 are preferably formed using lithography. However, other pattern-defining techniques may also suffice. As a result, an SEG mask 52 is formed having window openings exposing the surface of the drift region if present (FIG. 2A) or the surface of the SiC substrate if the drift region is not present.

The next step is optional and comprises removing down to a selected depth a portion of the SiC substrate or drift region in at least one window opening, thereby forming at least one trench in the exposed surface of the drift region or SiC substrate. This step is not shown in FIGS. 2A-2C. Following this step, the next step of conducting SEG first fills the trench or trenches with SiC material before forming the SiC mesas.

Next, at least one SiC mesa comprising a bottom SiC layer 53 and a top SiC emitter layer 54 is formed. The bottom SiC layer 53 of the same conductivity as drift region 51 is grown in the window openings in the mask using SEG (FIG. 2A). In a preferred embodiment of the invention, the SEG growth is low-temperature SEG conducted using a halo-carbon low-temperature epitaxial growth technique. As a result, the bottom SiC layer 53 is disposed on the surface of the drift region or the surface of the SiC substrate.

Next, the top SiC emitter layer 54 of the conductivity opposite from the bottom SiC layer 53 is grown in the window openings in the mask using SEG (FIG. 2A). The bottom SiC layer 53 and/or the top SiC emitter layer 54 may have doping changing with depth or it may be composed of multiple layers having different values of doping depending on targeted device functionality.

Next, metal layer 55 is deposited on the top of the structure preferably using blanket deposition (FIG. 2B). Metal layer 55 may comprise a plurality of layers made of different metals placed on top of each other depending on the requirements to metal contact and its integration with other layers. Without any addition photolithographic step, metal layer 55 will cover the top SiC emitter layer 54 and top of the SEG mask 52. In the next step, metal layer 55 is selectively removed and will remain only on the top of the top SiC emitter layer 54 thereby forming a contact on the top of the top SiC emitter layer 54 (FIG. 2B). In the preferred embodiment, the metal layer 55 is lifted-off by etching the SEG mask 52.

Alternatively, silicide regions are formed on top of the top SiC emitter layer 54 covered with metal layer 55 at the interface between the top SiC emitter layer 54 and metal layer 55. Then metal layer 55 is removed from the SEG mask 52 where silicide does not form.

A back-side ohmic contact can be formed using any of the known techniques. Another innovative concept of the invention involves forming the back-side ohmic contact using low-temperature epitaxial growth of a highly-doped epitaxial layer to reduce the back-side contact resistance, while protecting the entire front side of the wafer with the mask.

According to a second embodiment of the invention, SiC diodes with mesa edge termination regions are made using a self-aligned process (FIGS. 4A-4D). The diode comprises SiC substrate 100, an optional low or moderately doped drift region 101, emitter mesas 103, and metal contacts to the selectively-grown regions 106, as well as contacts to the SiC substrate 100. At least one optional mesa edge termination region 104 can be used.

Figure 4A:
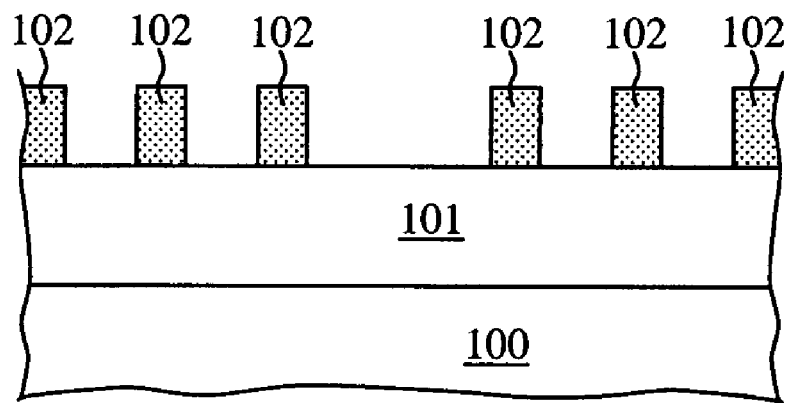
FIGS. 4A-4D depict the critical steps for the design and fabrication process of a SiC p-n junction diode with mesa edge termination regions.

The optional drift region 101 is formed on the surface of the SiC substrate 100 (FIG. 4A). The drift region 101 can be a low or moderately doped epitaxial layer grown on the surface of SiC substrate using regular-temperature epitaxial growth or low-temperature epitaxial growth (LTEG).

A masking layer 102 is formed on the top of drift region 101 if it is present or the surface of the SiC substrate 100 if the drift region 101 is not used (FIG. 4A). In a preferred embodiment of the invention, the masking layer 102 is made of deposited $SiO_2$ with a thickness in excess of 0.5 µm, although other low- and high-temperature masking materials, such as silicon nitride, aluminum nitride, graphite, carbon, polycrystalline silicon, and tantalum carbide can be used with thicknesses dictated by the targeted diode performance. The openings (window openings) in the masking layer 102 are formed (FIG. 4A) preferably using lithography. However, other pattern-defining techniques may also suffice. As a result, an SEG mask 102 is formed having window openings exposing the surface of the drift region 101 or the surface of the SiC substrate 100.

The next step is optional and comprises removing down to a selected depth a portion of the SiC substrate 100 or drift region 101 in at least one window opening, thereby forming at least one trench in the exposed surface of the drift region 101 or SiC substrate 100. This step is not shown in FIGS. 4A-4D. Following this step, the next step of conducting SEG first fills the trench or trenches with SiC material before forming the SiC mesas.

Figure 4B:
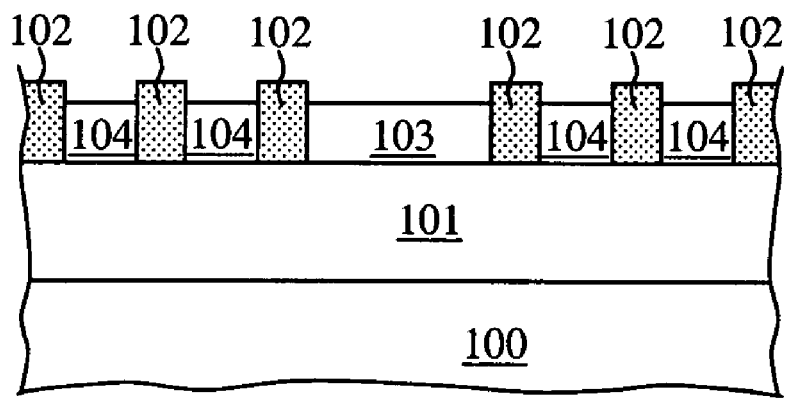

At least one SiC emitter mesa 103 is grown in the window openings in the mask using SEG (FIG. 4B). The SiC emitter mesa 103 can have doping (conductivity) changing with thickness or it can be composed of a few regions having different conductivity. In a preferred embodiment, the portion of the emitter mesas 103 that is the closest to the drift region 101 or to the surface of the SiC substrate 100 has the same conductivity as the drift region 101, while the top portions of the emitter mesas 103 have the opposite conductivity. In a preferable embodiment of the invention, the SEG growth is low-temperature SEG conducted using a halo-carbon low-temperature epitaxial growth technique. Further enhancement to the design may be provided by growing the mesa edge termination regions 104 simultaneously with the emitter regions 103 in the same SEG fabrication step. This enhancement only requires providing additional window openings in the SEG mask 102 to be subsequently used for SEG of the mesa edge termination regions 104.

Figure 4C:
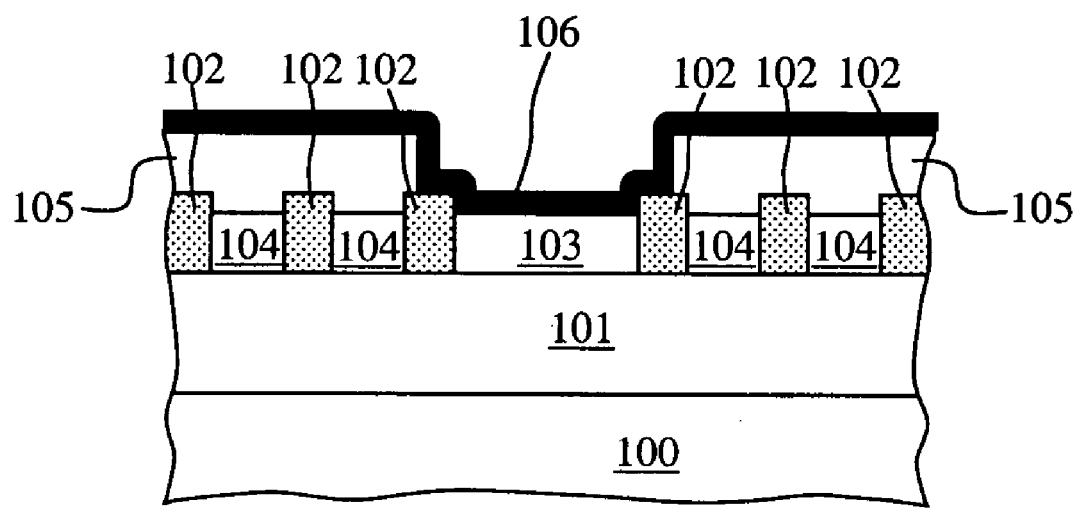

Next, metal layer 106 is formed. In the preferred embodiment of the invention, the metal layer 106 is deposited on the top of the structure using blanket deposition. Metal layer 106 may comprise a plurality of layers made of different metals depending on the requirements to metal contact and its integration with other layers. Without any additional photolithographic step, the metal will cover the emitter region 103, mesa edge termination regions 104, and the SEG mask 102. Alternatively, deposition of metal layer 106 on the mesa edge termination regions 104 can be avoided by preferably covering them the mesa edge termination regions 104 with photoresist or any other material that will serve as a mask for metal deposition 105 (as shown in FIG. 4C). The lithographic step that may be required to form the mask for metal deposition 105 does not compromise the advantages of the self-aligned process, since no precise alignment is required as long as the mesa edge termination regions 104 are covered with mask for metal deposition 105 while at least a portion of each emitter region 103 is free from the mask for metal deposition 105.

Figure 4D:
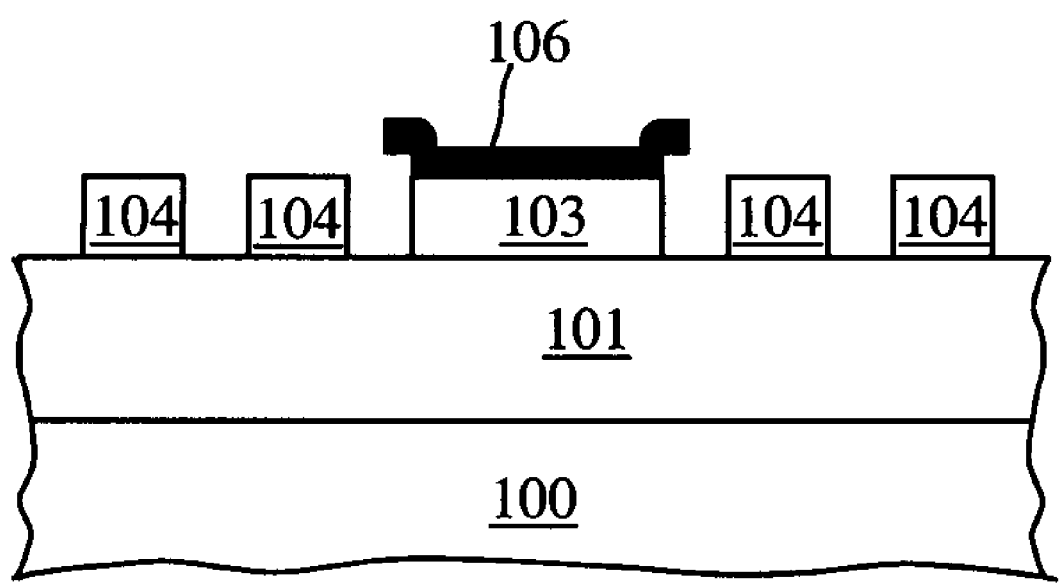

In the next step, the metal layer 106 is preferably lifted-off by etching the mask for metal deposition 105 and mask layer 102 (FIG. 4D). The metal will remain only on the top of the emitter region mesas 103 (FIG. 4D).

Figure 6A:
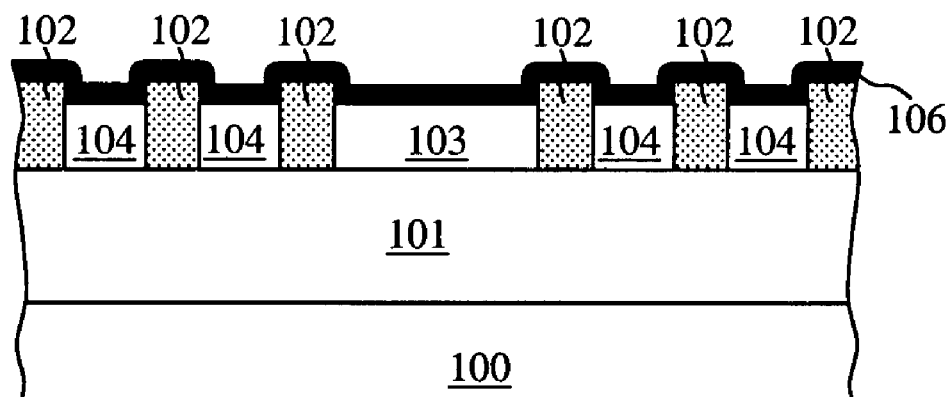
FIG. 6 depicts the critical steps for the alternative design and fabrication process of a SiC Schottky diode with mesa edge termination regions.
Figure 6B:
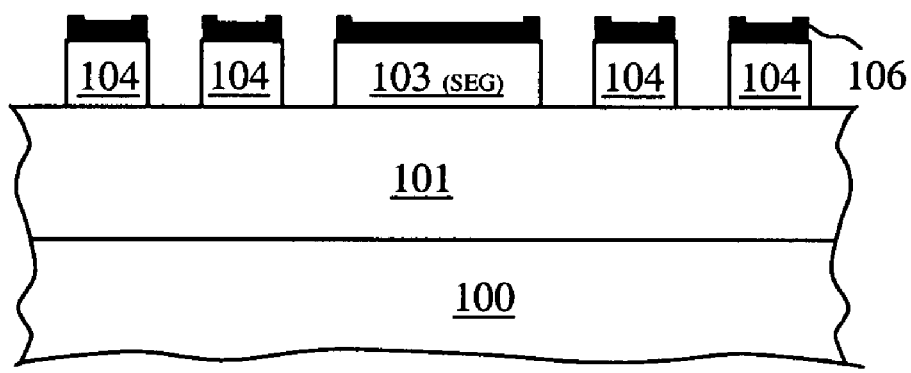
Figure 6C:
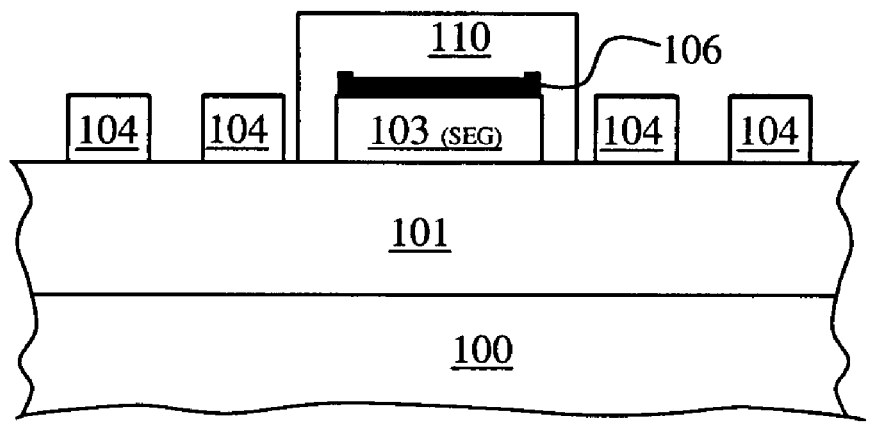

Alternatively, the metal can be deposited on all mesas— emitter region mesas 103 and mesa edge termination regions 104 (FIG. 6A)—prior to removing the SEG mask 102. The metal would be lifted-off by etching the SEG mask 102, or alternatively a salicide would be formed on all SiC mesas, while the metal will be removed from the mask were silicide does not form (FIG. 6B). The metal can be kept on all mesas while providing the final metal to only emitter region mesas 103. Alternatively, the metal (or salicide) formed on all emitter region mesas 103 and mesa edge termination regions 104 can be removed (e.g. etched) from the mesa edge termination regions 104 by preferably covering the emitter region mesas 103 with a photoresist mask 110 or any other masking material for metal etching (FIG. 6C). The lithographic step that may be required to form the photoresist mask 110 for etching the metal (or salicide) 106 does not compromise the advantages of the self-aligned process, since no precise alignment is required as long as the emitter region mesas 103 are covered with the mask. After the metal is removed from undesirable regions, the photoresist mask 110 is removed.

Salicide formation or an additional annealing step this leads to formation of the ohmic contacts. The final metal contacting the ohmic contacts may be formed using photolithography. Alternatively, the final metal can be formed along with the first metal in the same fabrication sequence using lift-off.

The back-side ohmic contact can be formed using any of the known techniques. Another innovative concept involves forming the back-side ohmic contact using low-temperature epitaxial growth of a highly-doped epitaxial layer on the back of the SiC substrate (e.g., on the back of the SiC wafer) to reduce the back-side contact resistance, while protecting the entire front side of the wafer with the mask.

Figure 5A:
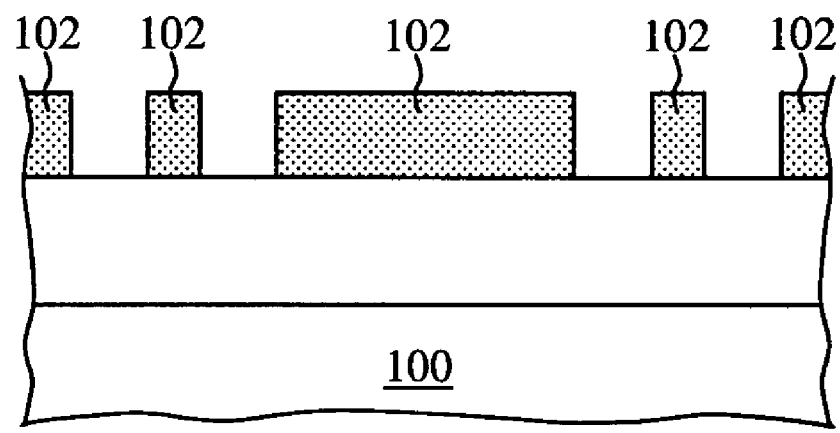
FIGS. 5A-5C depict the critical steps for the design and fabrication process of a SiC Schottky diode with mesa edge termination regions.
Figure 5B:
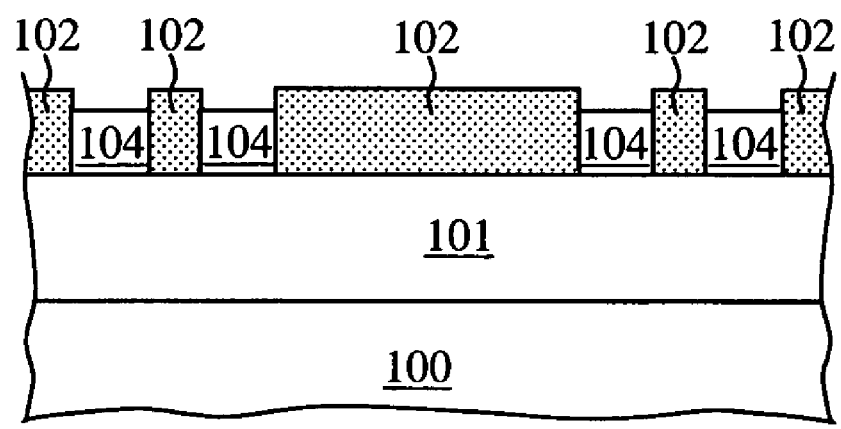
Figure 5C:
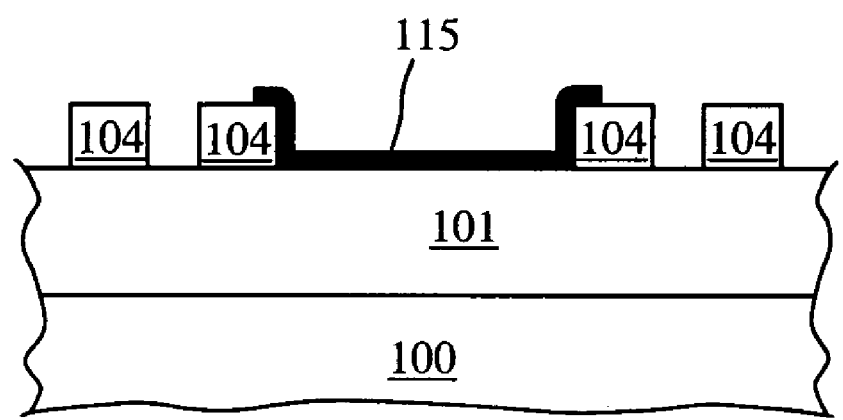

The same method as shown in FIGS. 4A-4D can be applied to form a SiC Schottky diode, as shown in FIGS. 5A-5C. In this case, only window openings for mesa edge termination regions 104 are formed in the SEG mask 102 (FIG. 5A) and optional trenches in those window openings are provided (not shown in the figure). Next, the mesa edge termination regions 104 are grown by SEG (FIG. 5B). After removing the SEG mask 102, the Schottky contact layer 115 is formed in the regions defined preferably by photolithography (FIG. 5C). As a result, the Schottky contact layer 115 is formed on a portion of the SiC drift region 101 (if the optional drift region 101 is present), or on a portion of the SiC substrate 100 if the drift region 101 is not present. The Schottky contact layer 115 may be allowed to form also on the sides and, if desired, on the tops of at least some of the mesa edge termination regions 104. However, depending on the doping of the mesa edge termination regions 104, the Schottky contact layer 115 may form a Schottky contact only on the SiC drift region 101 if present or on a portion of SiC substrate 100 if the drift region 101 is not present, while the Schottky contact layer 115 forms an ohmic contact with the mesa edge termination regions 104.

In another embodiment of the invention, SiC diodes are formed using a similar self-aligned process (FIGS. 7A-7I). However, a more involved combination of self-aligned steps is used to provide different doping of the emitter mesas and mesa edge termination regions grown by SEG. The diode comprises a SiC substrate 150, an optional low or moderately doped drift region 151, at least one SiC emitter mesa comprising a first layer of the emitter mesas 155 and a second layer 159, a plurality of mesa edge termination regions 156, and ohmic contacts 158 to the second layer 159 of the emitter mesa, as well as ohmic contacts to the SiC substrate 150. Mesa edge termination regions 156 can be doped differently from the first layer of the emitter mesas 155.

Figure 7A:
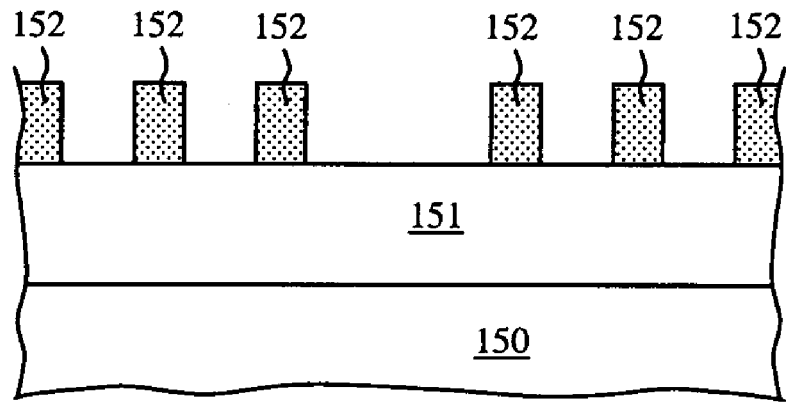
FIG. 7 depicts the critical steps for the alternative design and fabrication process of a SiC diode with mesa edge termination regions wherein the edge termination mesa and portion of emitter mesa have different doping or even different conductivity type.

The optional drift region 151 is formed on the surface of the SiC substrate 150 (FIG. 7A). The drift region 151 can be a low or moderately doped epitaxial layer grown on the surface of SiC substrate 150 using regular-temperature epitaxial growth or low-temperature epitaxial growth (LTEG).

A first SEG mask 152 is formed on the top of the drift region 151 if it is present or on the surface of the SiC substrate 150 if the drift region 151 is not present. Preferably, the first SEG mask 152 is made of deposited $SiO_2$ with the thickness in excess of 0.5 µm, although other low- and high-temperature masking materials can be used with thicknesses dictated by the targeted diode performance. The openings (window openings) in the first SEG mask 152 are formed using lithography or any other pattern-defining technique (FIG. 7A). The window openings are preferably simultaneously created for the SEG of the first layer of the emitter mesas 155 and for the mesa edge termination regions 156. As a result, the first SEG mask 152 is formed having window openings exposing the surface of the drift region 151 if present or the surface of the SiC substrate 150 if the drift region 151 is not present.

The next step is optional and comprises removing down to a selected depth a portion of the SiC substrate or drift region in at least one window opening, thereby forming at least one trench in the exposed surface of the drift region if it is present or SiC substrate if the drift region is not used. This step is not shown in FIGS. 7A-7I. Following this step, the next step of conducting SEG first fills the trench or trenches with SiC material before forming the SiC mesas.

Figure 7B:
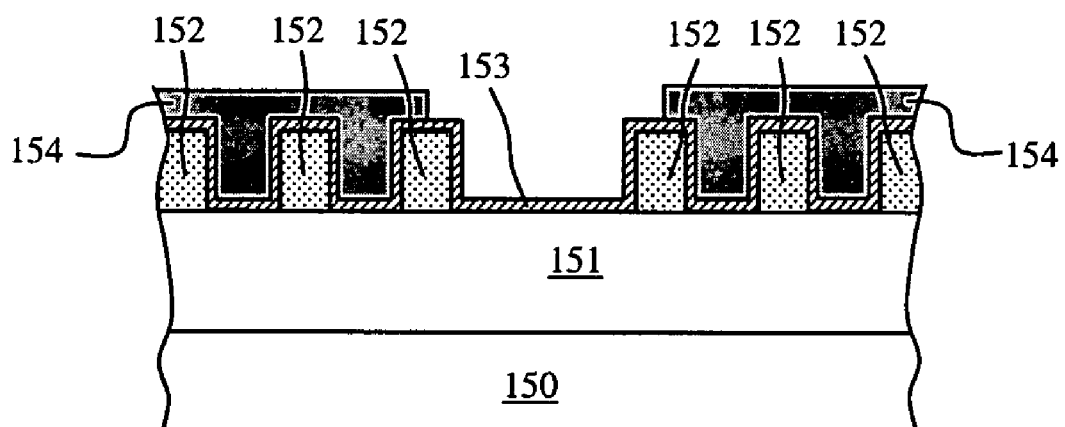
Figure 7C:
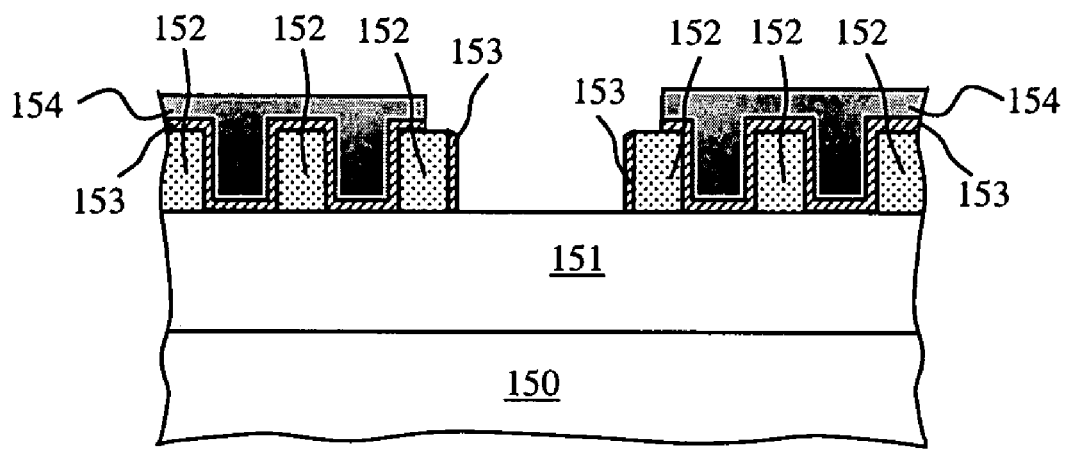
Figure 7D:
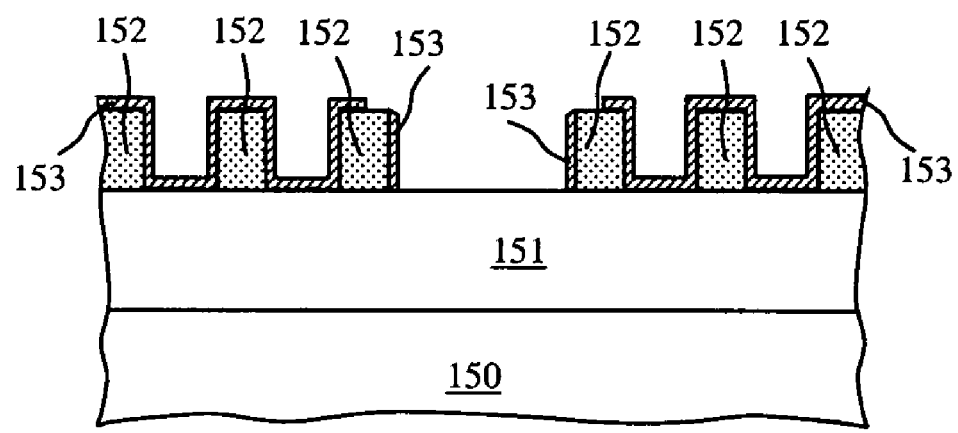
Figure 7E:
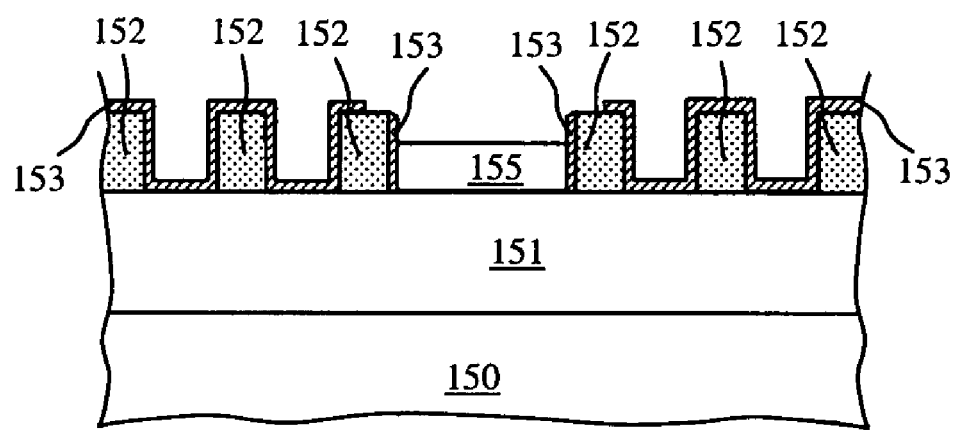

A second SEG mask 153 (normally thinner than the first SEG mask 152) is formed on the top of the first mask 152 (FIG. 7B). The second SEG mask 153 is made of a material preferably different from the first SEG mask 152. In the preferred embodiment of the invention, the material for the second SEG mask 153 is silicon nitride. However, other masking materials such as, aluminum nitride, graphite, carbon, polycrystalline silicon, and tantalum carbide may be used for the second SEG mask 153.

The next step ensures that the second SEG mask 153 is covering the first SEG mask 152, such that a first portion of the second SEG mask 153 is covering the exposed surface of the SiC substrate 150 or drift region 151 in a first group of the plurality of the window openings of the first SEG mask 152 and a second portion of the second SEG mask 153 is not covering the exposed surface of the SiC substrate 150 or drift region 151 in a second group of the plurality of the window openings of the second SEG mask 153. Preferably, photoresist or any other kind of mask 154 for etching the second SEG mask 153 is formed covering the window openings to be used for forming the mesa edge termination regions 156 and the second layer of the emitter mesa 159 while keeping the window openings to be used for forming the first layer of the emitter mesas 155 exposed (FIG. 7B). The lithographic step that may be required to form the photoresist/mask 154 does not compromise the advantages of the self-aligned process, since no precise alignment is required as long as the window openings for the mesa edge termination regions 156 are covered with the photoresist/mask 154 while the window openings for the first layer of the emitter mesas 155 are free from the mask. Next, the second SEG mask 153 is removed in the window openings to be used for forming the first layer of the emitter mesas 155. Preferably, anisotropic etch of the second SEG mask 153 is conducted in the openings of the photoresist/mask 154. The etch is conducted until the surface of SiC is exposed in the emitter window openings formed in the first SEG mask 152. Alternatively, a directional etch can be used (FIG. 7C) which can work even when the material for the second SEG mask 153 is the same as that of the first SEG mask 152.

The photoresist/mask 154 is removed (FIG. 7D) and SEG of the first layer of the emitter mesas 155 is conducted (FIG.

7E). No SiC growth exists in the edge termination window openings since the SiC surface in those window openings remains covered with the second SEG mask 153. No nucleation occurs on the mask when the SEG process is used. The first layer of the emitter mesas 155 can have doping (conductivity) changing with thickness or it can be composed of a few regions having different conductivity. In the preferred embodiment of the invention, the portion of the first layer of the emitter mesas 155 that is the closest to the drift region 151 if present or the surface of the SiC substrate 150 if the drift region 151 is not present has the same conductivity as the drift region 151, while the top portions of the emitter mesas 155 have the opposite conductivity.

Figure 7F:
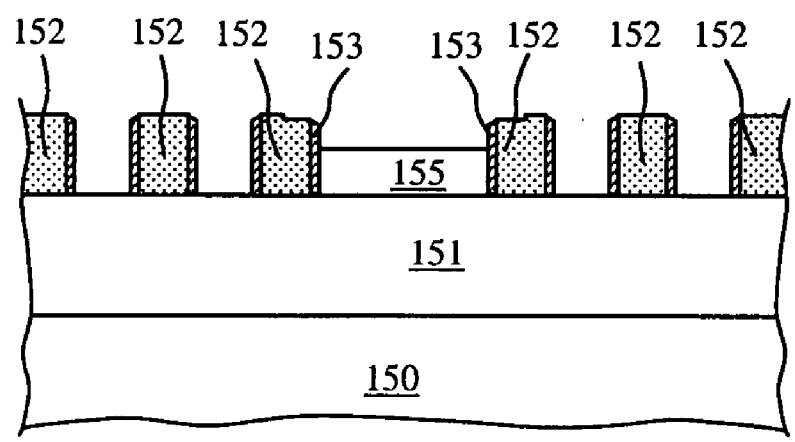

Without any additional photolithographic steps, the SiC surface of the drift region 151 if present or the surface of the SiC substrate 150 if the drift region 151 is not present in the remaining windows (edge termination window openings) is exposed by preferably performing anisotropic etching of the remaining second SEG mask 153 (FIG. 7F). Simultaneously, the first SEG mask 152 gets thinned during etching by approximately the thickness of the second SEG mask 153, which does not cause any problems since the second SEG mask 153 can be selected sufficiently thinner than the first SEG mask 152. After the anisotropic etching, the second SEG mask 153 remains only on the sidewalls of the window openings. Alternatively to the directional etching, the remaining second SEG mask 153 can be removed by selective etching not attacking the first SEG mask 152.

Figure 7G:
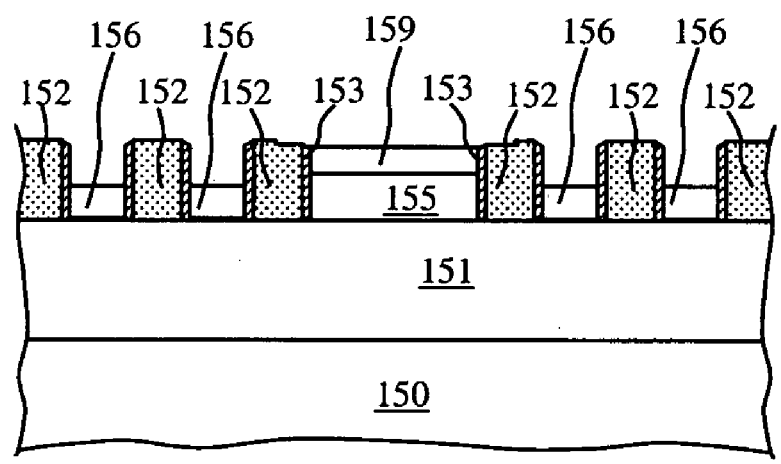

Without any additional photolithographic steps, SEG of SiC can be conducted to grow mesa edge termination regions 156 in the window openings of the SEG mask (FIG. 7G). This allows having mesa doping and the doping at the top of the emitter different from the doping of the first layer of the emitter mesas 155. Simultaneously, additional SEG growth of SiC takes place in the emitter window opening to produce the second layer of the emitter mesas 159 on the top of the first layer of the emitter mesas 155 (FIG. 7G). If the doping of the mesa edge termination regions 156 and the second layer of the emitter mesas 159 on the top of the first layer of the emitter mesas 155 is higher than that of the top portion of the first layer of the emitter mesas 155, this could offer the additional advantage of a better ohmic contact to the second layer of the emitter mesas 159 on the top of the first layer of the emitter mesas 155.

Alternatively, the photoresist/mask 154 (FIG. 7B) could be formed in the opposite fashion—to expose the second SEG mask 153 in edge termination window openings while covering the emitter window openings. In that case, mesa edge termination regions 156 could be formed by SEG first, followed by formation of the first layer of the emitter mesas 155 that can be doped differently from the mesa edge termination regions 156.

Figure 7H:
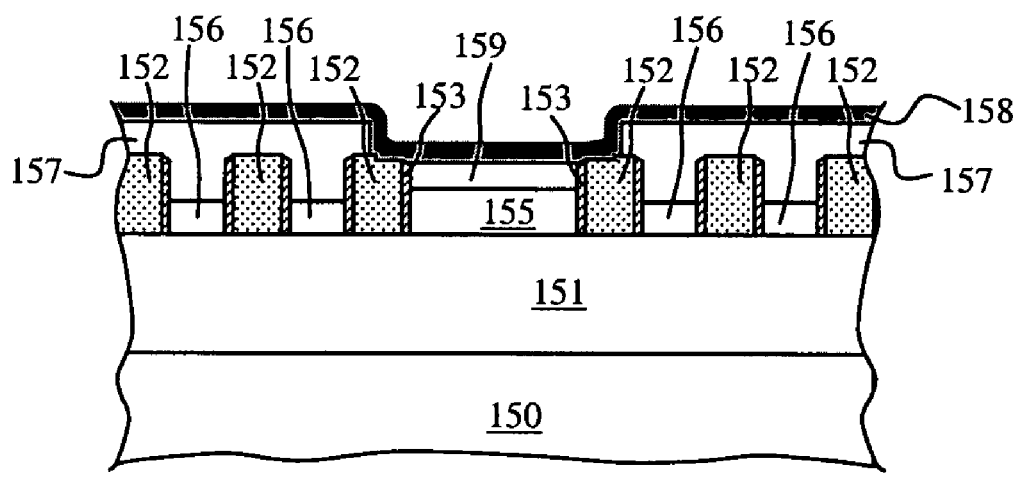
Figure 7I:
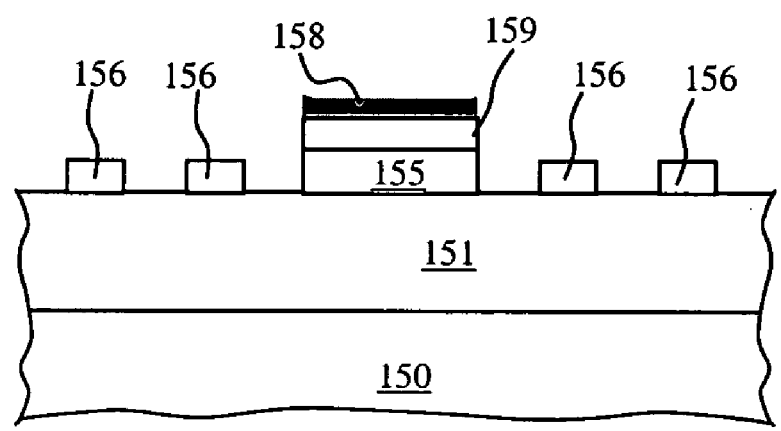

Contacts can be formed following one of the alternative approaches described in the first and the second embodiment of the invention. The steps shown in FIGS. 7H-7I illustrate formation of the photoresist/mask 157, deposition of the metal 158 (single or multilayer) (FIG. 7H), followed by metal lift-off by removing photoresist/mask 157 and SEG masks 152 and 153 (FIG. 7I). Alternatively, salicide can be formed on the top of the emitter mesas as previously described following removal of the photoresist/mask 157.

Silicide formation or an additional annealing step leads to formation of the ohmic contacts. The final metal contacting the ohmic contacts may be formed using photolithography. Alternatively, the final metal can be formed along with the first metal in the same fabrication sequence using lift-off.

The back-side ohmic contact can be formed using any of the known techniques. Another innovative concept involves forming the back-side ohmic contact using low-temperature epitaxial growth of a highly-doped epitaxial layer to reduce the back-side contact resistance, while protecting the entire front side of the wafer with the mask.

In one alternative embodiment (with the final configuration looking exactly the same as in FIG. 7I), the first layer of the emitter mesas 155 is forming having the same conductivity as the drift region 151, while the second layer of the emitter mesas 159 and the mesa edge termination regions 156 are forming having conductivity opposite to the first layer of the emitter mesas 155. This will enable the structure having the p-n junction of the diode being formed to be positioned between the first layer of the emitter mesas 155 and the second layer of the emitter mesas 159 on the top of the first layer of the emitter mesas 155 formed in the same window opening.

In another embodiment of the invention, a SiC diode combining merged p-n/Schottky junctions is formed using a self-aligned process (FIGS. 8A-8E). The principle of operation of this type of diode is well-known. The diode operation is determined by the Schottky junction as in a regular Schottky diode. The p-n junctions serve as edge terminations and provide control of the reverse bias current when at reverse bias. In addition, p-n junctions also influence forward characteristics. The diode comprises SiC substrate 200, an optional low or moderately doped drift region 201, SEG emitter mesas 203, ohmic contacts 204 to the selectively-grown SEG emitter mesas (SEG emitters) 203, Schottky metal and final metal 205, Schottky contacts 206 to SiC in-between emitter mesas, as well as ohmic contacts to the SiC substrate 200. Optional mesa edge termination regions formed by SEG similar to the ones described in previous embodiments can be used.

Figure 8A:
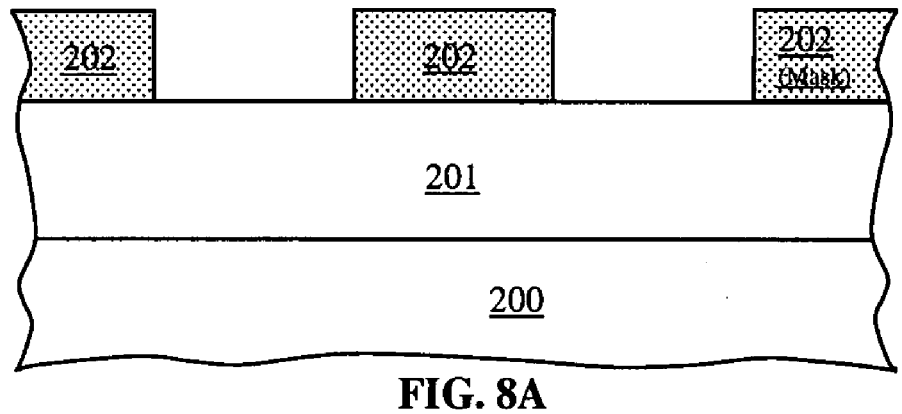
FIG. 8 depicts the critical steps for the design and fabrication process of a SiC diode comprising p-n junctions and Schottky junctions.

The optional drift region 201 is formed on the surface of the SiC substrate 200 (FIG. 8A). The drift region 201 can be low or moderately doped epitaxial layer grown on the surface of the SiC substrate 200 using regular-temperature epitaxial growth or low-temperature epitaxial growth (LTEG).

An SEG mask 202 is formed on the top of the drift region 201 if present or on the surface of the SiC substrate 200 if the drift region 201 is not present. In a preferred embodiment of the invention, the SEG mask 202 is made preferably of deposited $SiO_2$ with the thickness in excess of 0.5 µm, although other low- and high-temperature masking materials can be used with thicknesses dictated by the targeted diode performance. The openings (window openings) in the SEG mask 202 are preferably formed using lithography. However, other pattern-defining techniques (FIG. 8A) may be used. The window openings are preferably made simultaneously for SEG emitter mesas 203 to be formed in subsequent steps (FIG. 8C) and for the optional edge termination regions (not shown in the figure). As a result, the SEG mask 202 is formed having window openings exposing the surface of the drift region 201 if present or the surface of the SiC substrate 200 if the drift region is not present.

Figure 8B:
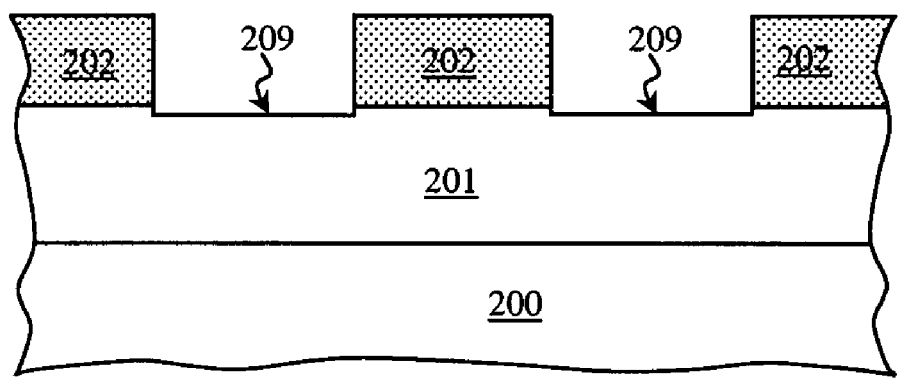

The next step is optional and is shown in FIG. 8B. It comprises removing down to a selected depth a portion of the SiC substrate 200 or drift region 201 in at least one window opening, thereby forming at least one trench 209 in the exposed surface of the drift region 201 (FIG. 8B) or the SiC substrate 200. Following this step, the next step of conducting SEG first fills the trench or trenches with SiC material before forming the optional part of SiC mesas protruding above the substrate surface. If the at least one trench 209 is not formed, the SEG will automatically result in forming SiC mesas protruding above the substrate surface.

Figure 8C:
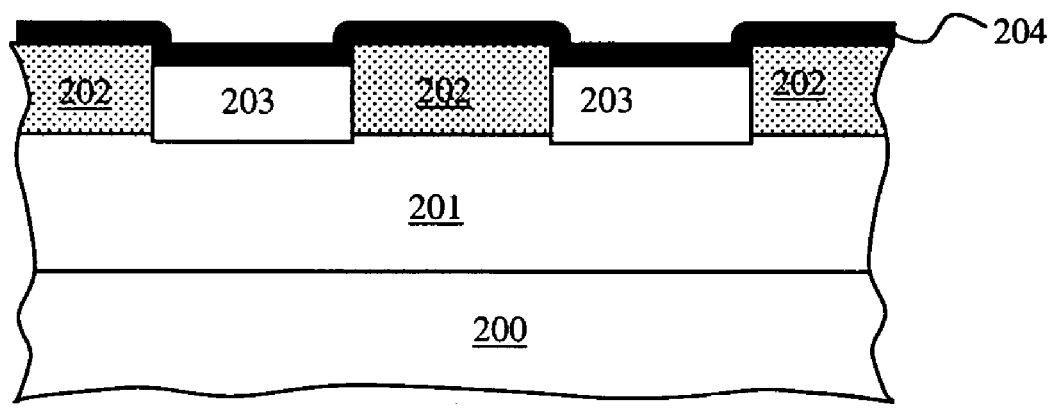

Emitter mesas 203 are grown in the window openings in the SEG mask 202 using SEG (FIG. 8C). The emitter mesas 203 can have doping (conductivity) changing with thickness or it can be composed of a few regions having different conductivity. In the preferred embodiment of the invention, the emitter mesas 203 have conductivity opposite from the conductivity of the drift region. Further enhancement to the design may be provided by growing the mesa edge termination regions (not shown) simultaneously with the emitter mesas 203 in the same SEG fabrication step. This enhancement only requires providing additional window openings in the SEG mask 202 simultaneously with forming the emitter window openings in the previous fabrication step.

Next, ohmic contacts on the SiC emitter mesas 203 are formed. In the preferred embodiment, a metal layer 204 is deposited on the top of the structure preferably using blanket deposition (FIG. 8C). The metal layer 204 may comprise a plurality of layers made of different metals depending on the requirements to metal contact and its integration with other layers. Without any additional photolithographic step, the layer of the metal contact 204 will cover the emitter mesas 203, optional mesa termination regions (not shown), and the SEG mask 202. Alternatively, deposition of the metal layer 204 on the mesa termination regions can be avoided (not shown) by covering them preferably with photoresist or any other masking material for metal deposition, as was described in a previous embodiment of the invention.

Figure 8D:
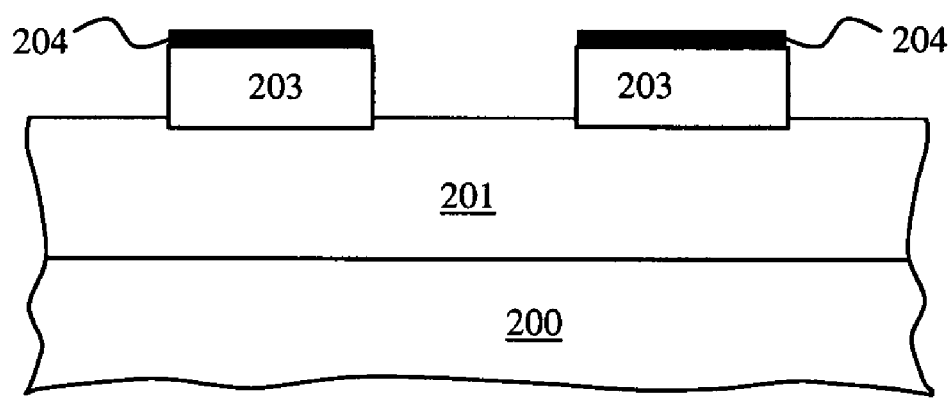

Next, a part of the metal layer 204 is preferably lifted-off by etching the SEG mask 202. Alternatively a silicide is formed on all SiC mesas, while the metal is removed from the mask were silicide does not form (FIG. 8D). The metal can be kept on all mesas—emitter mesas 203 and optional mesa edge termination regions (not shown), while being later used only for providing the ohmic contact to only the emitter mesas 203. Alternatively, as described in previous embodiments of the invention, the metal (or salicide) formed on all emitter mesas and mesa edge termination regions can be removed (e.g. etched) from the mesa edge termination regions by covering the emitter mesas 203 preferably with photoresist or any other masking material for metal etching.

Figure 8E:
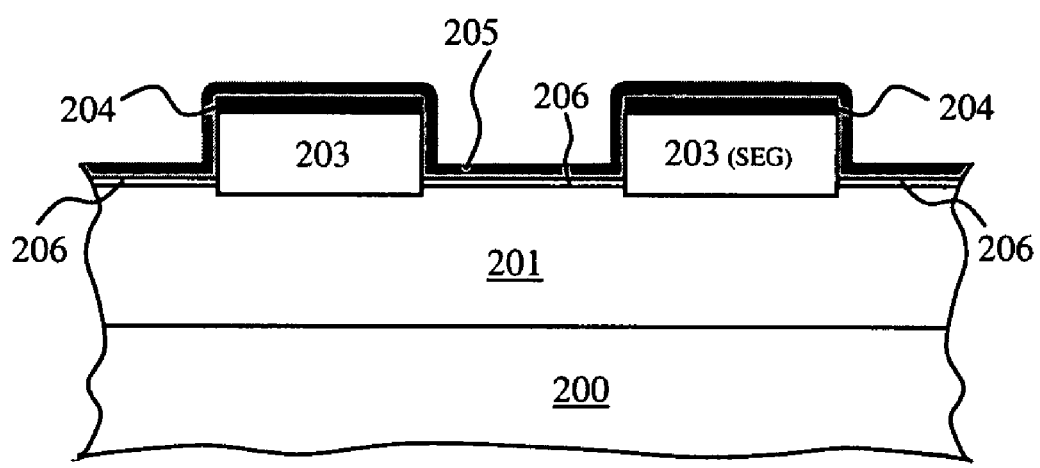

Next, at least one Schottky contact 206 is formed on the drift region 201 if present or on SiC substrate 200 between at least two of the plurality of emitter mesas 203. Preferably, a blanket deposition of a metal layer 205 comprising at least a Schottky metal layer and optionally the final metal layer is conducted (FIG. 8E). The Schottky contact 206 automatically forms at the interface between the Schottky metal layer and drift region 201 or the SiC substrate 200. This contact forms in-between the emitter mesas and on the mesa walls, while the contact at the top of the emitter mesas 203 at the interface between the emitter mesas 203 and the remaining portion of the metal layer 204 are ohmic as described above. The metal layer 205 and the remaining portion of the metal layer 204 at the top of the emitter mesas 203 are automatically in an electric contract with each other.

Photolithography that does not compromise the advantages of the self-aligned fabrication process can be used to avoid final metal formation on the top of the mesa edge termination regions if such regions are employed in the design.

The back-side ohmic contact can be formed using any of the known techniques. Another innovative concept involves forming the back-side ohmic contact using low-temperature epitaxial growth of a highly-doped epitaxial layer to reduce the back-side contact resistance, while protecting the entire front side of the wafer with the mask. However, this step may be conducted at any stage prior to Schottky metal deposition.

In an additional variation of this embodiment, silicide formation and ohmic contact formation to the SiC mesas is omitted, with only Schottky metal formed on the sidewalls and the top of the mesas. In that case, the mesa structures serve merely as edge termination regions self-aligned with the Schottky contact.

In a further preferred embodiment of the invention, a device structure suitable for SiC vertical junction field effect transistor (VJFET) or static induction transistor (SIT) is formed using self-aligned processes (FIGS. 9A-9H). The device comprises a SiC substrate 300, an optional low or moderately doped drift region 301, at least one SiC channel mesa 303 at least a portion of which has the same conductivity as the drift regions 301, at least one gate region 305 at least portion of which has the conductivity opposite to that of the channel mesa 303, at least one gate-contact region 306 of the conductivity opposite to that of the channel mesas 303 but higher doped than the tops of the gate regions 305 to form good ohmic contact, ohmic contacts 312 to the gate regions 305 and channel mesas 303, optional final metal 313 to the gate regions 305 and channel mesas 303, as well as contacts to the SiC substrate 300. Optional mesa edge termination regions formed by SEG similar to the regions described in previous embodiments may be used.

Figure 9A:
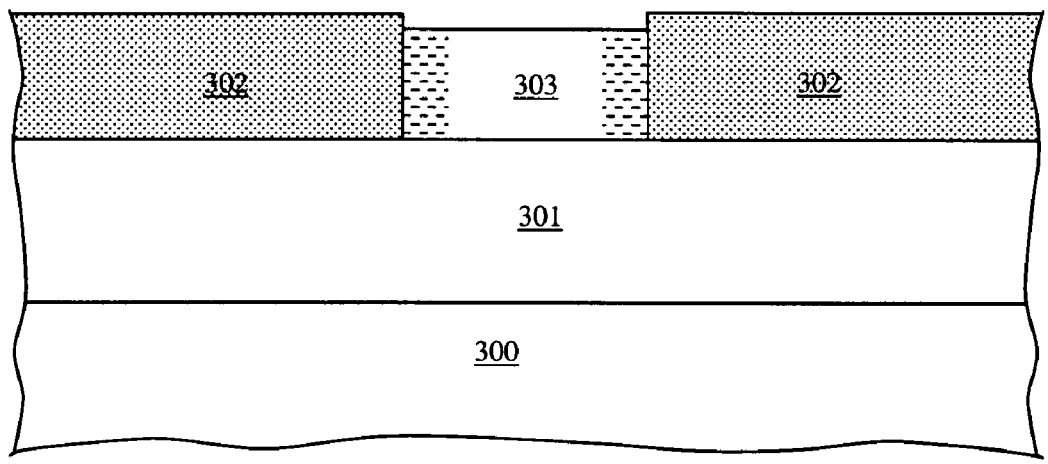
FIG. 9 depicts the critical steps for the design and fabrication process of a SiC transistor.

The optional drift region 301 is formed on the surface of the SiC substrate 300 (FIG. 9A). The drift region 301 can be low or moderately doped epitaxial layer grown on the surface of SiC substrate 300 using regular-temperature epitaxial growth or low-temperature epitaxial growth (LTEG)

Next, the SiC channel mesa 303 is formed. In one embodiment for channel mesa formation, the following procedure is used. A channel-SEG mask 302 is formed on the top of the drift region 301 if present or on the surface of the SiC substrate 300 if the drift region 301 is not present. In a preferred embodiment of the invention, the channel-SEG mask 302 is preferably made of deposited $SiO_2$ with the thickness in excess of 0.5 μm, although other low- and high-temperature masking materials can be used with thicknesses dictated by the targeted diode performance. The openings (window openings) in the channel-SEG mask 302 are formed (FIG. 9A). The window openings are formed preferably using lithography. However, other pattern-defining techniques may suffice. The window openings are preferably made simultaneously for the channel mesas 303 (FIG. 9A) and for the optional edge termination regions (not shown in the figure).

The next step is optional and is not shown in FIGS. 9A-9H. It comprises removing down to a selected depth a portion of the SiC substrate 300 or drift region 301 in at least one window opening, thereby forming at least one trench in the exposed surface of the drift region 301 or the SiC substrate 300. Following this step, the next step of conducting SEG first fills the trench or trenches with SiC material before forming the SiC mesas.

Channel mesas 303 of the same conductivity as the drift regions 301 are grown in the window openings in the channel-SEG mask 302 using SEG (FIG. 9A). The value of doping of channel mesas 303 is selected to improve device performance. The doping can vary with thickness. The doping and dimensions of the channel may be selected to enable normally-off VJFET. Further enhancement to the design may be provided by growing the optional mesa edge termination regions (not shown) simultaneously with the channel mesas 303 in the same SEG fabrication step. This enhancement only requires providing additional window openings for the SEG in the channel-SEG mask 302 simultaneously with the channel mesa window openings in the previous fabrication step.

Still further enhancement of the design and fabrication process may utilize doping of portions of the channel mesas 303 close to the mesa walls to conductivity opposite that of the channel. This doping can be done by release of dopant species from an intentionally-doped channel-SEG mask 302 and incorporation of the released dopant species in the regions of the channel mesa 303 close to the mask (so-called "autodoping"). While autodoping is not a new phenomenon, its use for SiC applications and for SEG of SiC in particular is novel. This doping technique can provide a portion of the gate regions. This extension of the gate regions laterally deeper in the bulk of the channel mesa can be used to enable normally-off VJFET.

In an alternative embodiment for the channel mesa formation (not shown in figures), the channel mesas are formed not by SEG but by performing regular blanket (non-selective) growth of SiC layer, followed by etching to define channel mesas. The mask that is used for etching (etch-mask) to define the mesas (e.g., $SiO_2$ mask) is subsequently used as a portion of the mask located on top of the channel mesas and is used for a subsequent SEG step (i.e., gate-SEG mask).

Figure 9B:
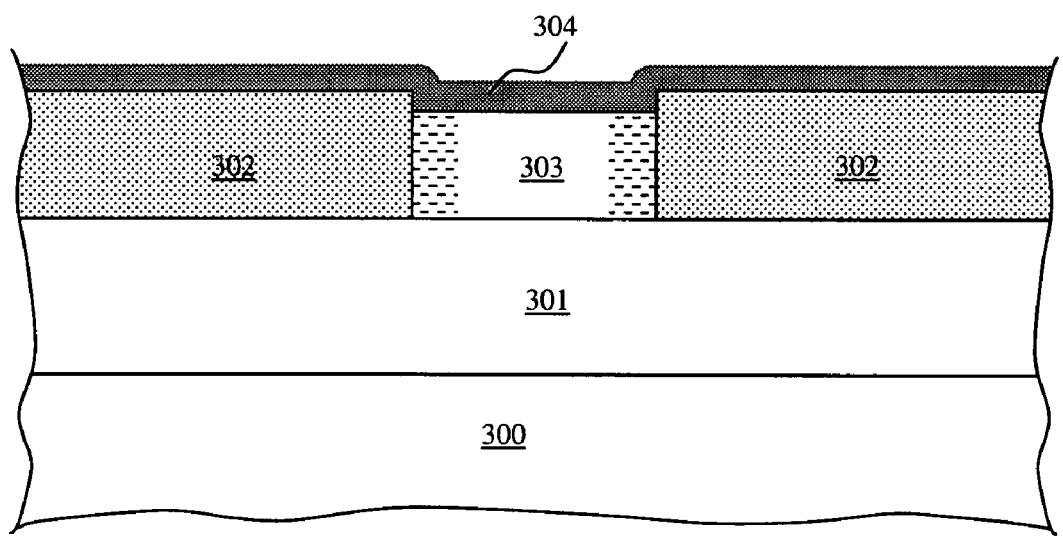

Next, a gate-SEG mask is formed. If the channel mesas were formed by SEG in the previous step, the following procedure is used. The gate-SEG masking layer 304 is formed on the top of the channel-SEG mask 302 and preferably simultaneously on the top of the channel mesas 303, as shown in FIG. 9B. The gate-SEG masking layer 304 is preferably made of a material different from the channel-SEG mask 302. Preferably, the material for the gate-SEG masking layer 304 can be silicon nitride. However, other masking materials such as aluminum nitride, graphite, carbon, polycrystalline silicon, and tantalum carbide suitable for subsequent SEG can be used.

Figure 9C:
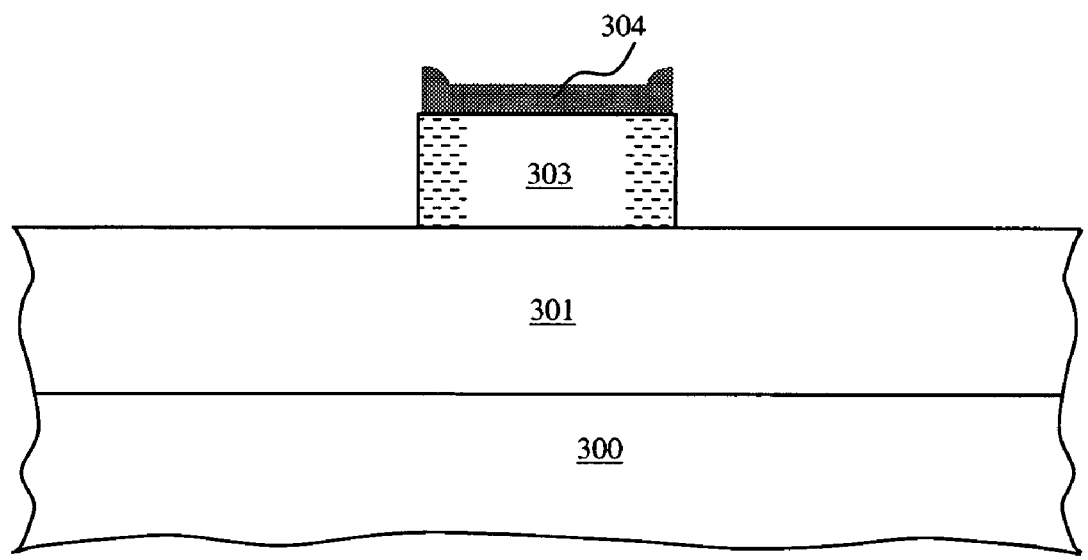

Next, the portion of the gate-SEG masking layer 304 that is located on the top of the channel-SEG mask 302 is removed preferably by lift-off using selective etching of the underlying channel-SEG mask 302 (FIG. 9C). If necessary, in order to expose the channel-SEG mask 302 for etching and lift-off of the gate-SEG masking layer 304, openings in the gate-SEG masking layer 304 can be etched preferably using photolithography not requiring any precise alignment. As a result of the lift-off, the gate-SEG masking layer 304 will remain only on the top of the channel mesas 303 (FIG. 9C) (as well as on the top of the optional mesa edge termination regions which are not shown; the presence of the mask on the top of the optional mesa edge termination regions is irrelevant for further processing and for device operation). Other methods suitable for removing the gate-SEG masking layer 304 from everywhere except where it is located on the top of the channel mesas 303 (as well as on the top of the optional mesa edge termination regions if present) can be used. As a result, the process steps result in forming at least one gate-SEG mask 304 disposed on the top surface of at least one SiC channel mesa 303 (FIG. 9C).

Alternatively, if the channel mesas 303 were formed by performing regular blanket (non-selective) growth and etching as described above, the etch-mask that was used during etching to form mesas by removing the regions not protected with the etch-mask (e.g., $SiO_2$ mask) will remain only on the tops of the channel mesas 303 and will serve the purpose of the gate-SEG mask 304 located on the top of the channel mesas 303 as shown in FIG. 9C.

Figure 9D:
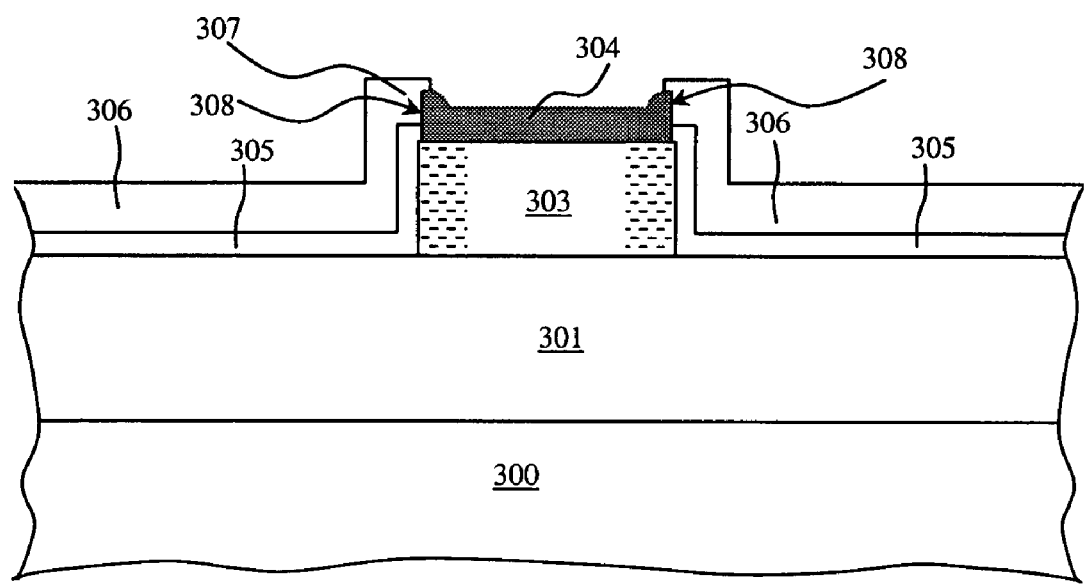

Next, SiC gate regions 305 are grown by SEG on the top of the drift region 301 if present or the surface of the SiC substrate 300 if the drift region 301 is not present and on the sidewalls of the channel mesas 303 (FIG. 9D). The growth does not occur on the top of the mesas since they are covered with the gate-SEG masking layer 304. The SiC gate regions 305 are doped during SEG to achieve conductivity opposite to that of the channel. After a desirable thickness of SiC gate regions 305 is achieved, additional SEG SiC material serving as gate-contact regions 306, of the same conductivity but of different doping than the SiC gate regions 305, can be grown in the same SEG run or, if necessary in an additional SEG run (FIG. 9D). In a preferred embodiment of the invention, an additional SEG SiC region serves as the gate-contact regions 306 and therefore is made higher-doped than the gate regions 305.

Growth of the gate-contact regions 306 of sufficient thickness serves a critical role for the self-aligned process and illustrates another important advantage of this invention. The growth of gate regions 305 as well as gate-contact regions 306 on the side walls has a component perpendicular to the sidewall and the lateral growth component 307, which results in a growth above the vertical portion of the gate-SEG masking layer 304. The lateral growth component 307 of the gate regions 305 and/or the gate-contact regions 306 during the growth on the sidewalls of the channel mesas 303 produce vertical sidewalls 308, which can be used to form a spacer to provide self-aligned contacts to the channel mesas 303 and to the gate-contact regions 306 separated from (not in contact with) each other.

Next, a few additional modifications (or a combination of a few additional modifications) are possible. All such modifications allow implementation of the same self-aligned principle while introducing different degrees of complications and slight modifications in the sizes of the elements of the final topology.

If the lateral growth component 307 of the gate regions 305 and/or gate-contact regions 306 extend over the gate-SEG masking layer 304 when growing vertically (in respect to the drawing), the lateral growth may continue above the mask not only in the vertical (in respect to the drawing) direction but also in the horizontal (in respect to the drawing) direction covering the portion of the gate-SEG masking layer 304 from the top (FIG. 9D).

Figure 9E:
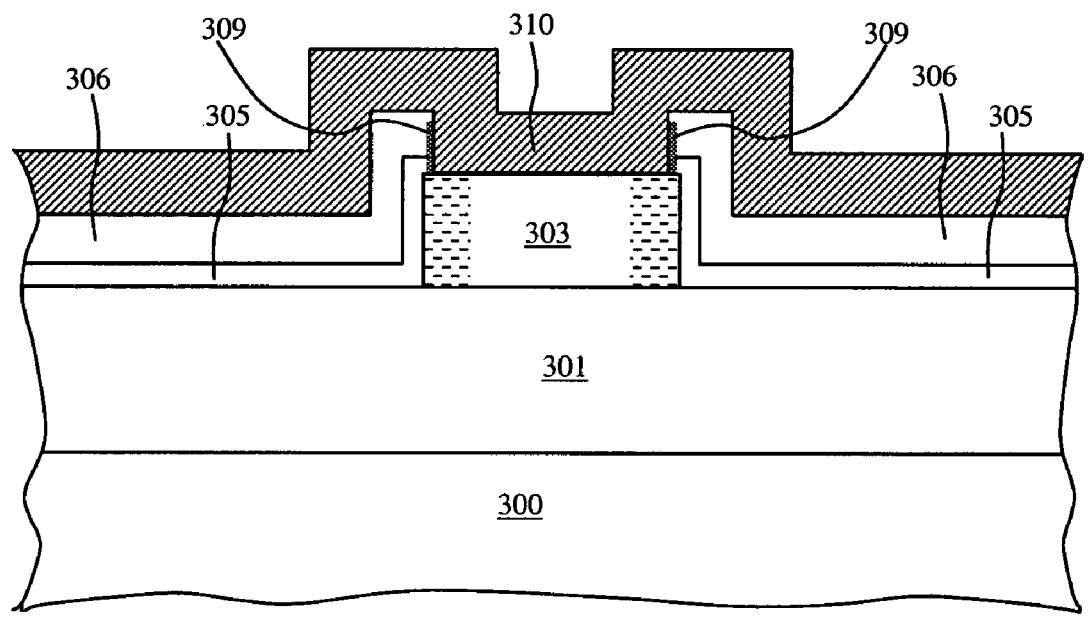

Next, if anisotropic (directional) etching of the gate-SEG masking layer 304 is performed, a spacer 309 comprising a portion of the gate-SEG masking layer 304 is formed. If isotropic etching is used instead, the entire gate-SEG masking layer 304 is removed exposing the top surface of the channel mesa 303 and the vertical sidewalls 308 of the gate regions 305 and/or gate-contact regions 306 without forming a spacer 309. Similarly, if in the previous step no lateral growth took place in the horizontal (in respect to the drawing) direction covering the portion of the gate-SEG masking layer 304 from the top, either anisotropic or isotropic etching results in exposed vertical sidewalls 308 of the gate regions 305 and/or gate-contact regions 306 without forming a spacer 309. Only the situation with forming spacer 309 is shown in FIG. 9E.

Figure 9F:
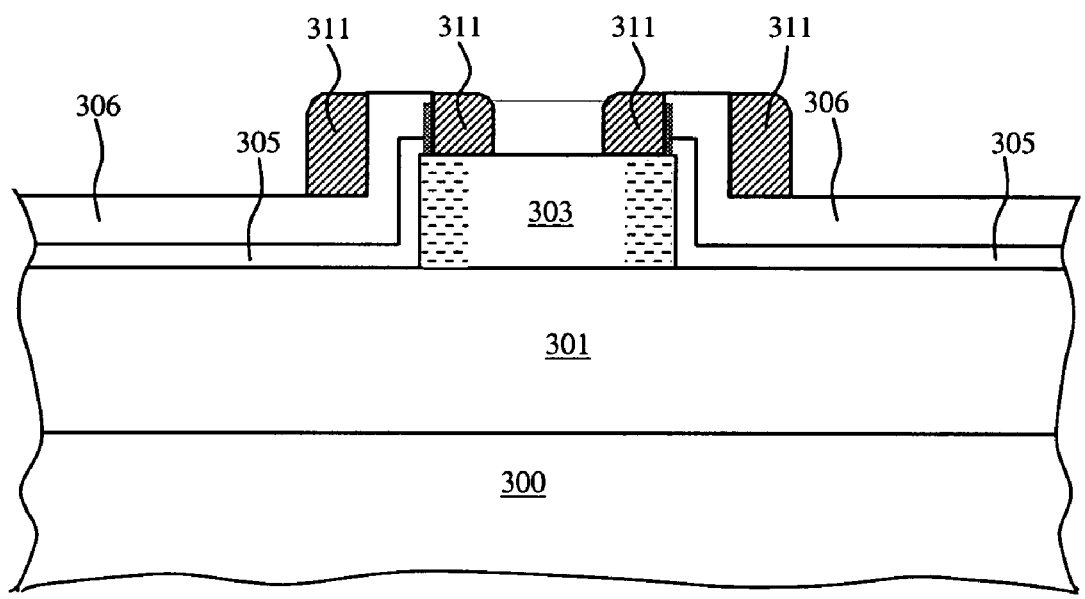

The next step forms a sidewall spacer—an additional spacer on the vertical sidewalls 308 of the gate regions 305 and/or the gate-contact regions 306—for metal contact formation via self-aligned silicide (salicide) formation or metal contact deposition. If the spacer 309 has been formed in the previous steps, this step is optional. Any method for spacer formation can be used. In preferable method, a masking layer 310 is blanket-deposited on the top of the structure, as shown in FIG. 9E. The masking layer 310 can be of $SiO_2$ or other materials such as nitrides, etc. Next, the mask is preferably anisotropically (directionally) etched to expose the horizontal (in respect to the drawing) surfaces of the gate-contact regions 306 and channel regions 303. The anisotropic etching results in the vertical sidewalls 308 of the gate regions 305 and/or gate-contact regions 306 covered with spacers 311 left from the directionally etched masking layer 310 (FIG. 9F).

Figure 9G:
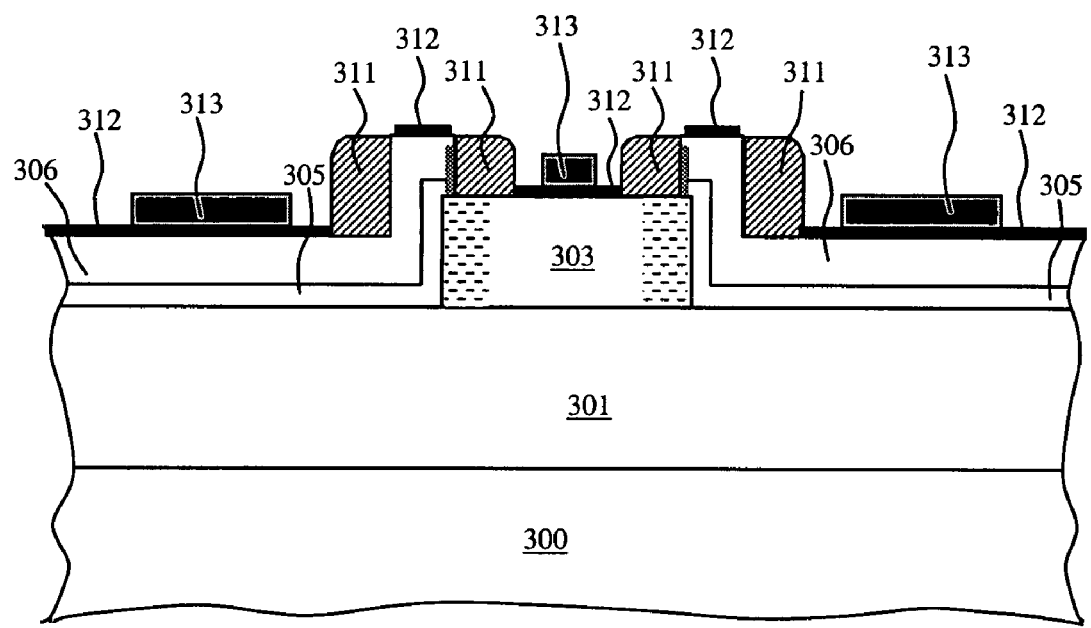

Next, contacts are formed. In general, the contacts are ohmic and contacts on the SiC channel mesas are separated from the contact on the gate-contact region by the sidewall spacer formed as was described above. In one embodiment, an ohmic contact layer (made of metal, semiconductor, or any other material) is deposited on the top of the structure using blanket deposition. Then the metal is selectively removed, preferably lifted-off by etching the spacers 311 (not shown), while remaining on the horizontal (in respect to the drawings) surfaces of the gate-contact regions 306 and channel regions 303. Alternatively, salicide regions 312 are formed on horizontal SiC surfaces (on the channel regions 303 and on the gate-contact regions 306), while the metal is removed from the spacers 311 where salicide does not form (FIG. 9G). In either case, with silicide formation or with an additional metal annealing step, this process leads to formation of ohmic contacts 312 to the channel regions 303 and on the gate-contact regions 306 separated (isolated) from each other by the self-aligned process using additional spacer 311. Ohmic contacts 312 may comprise a single layer or a plurality of layers.

Figure 10:
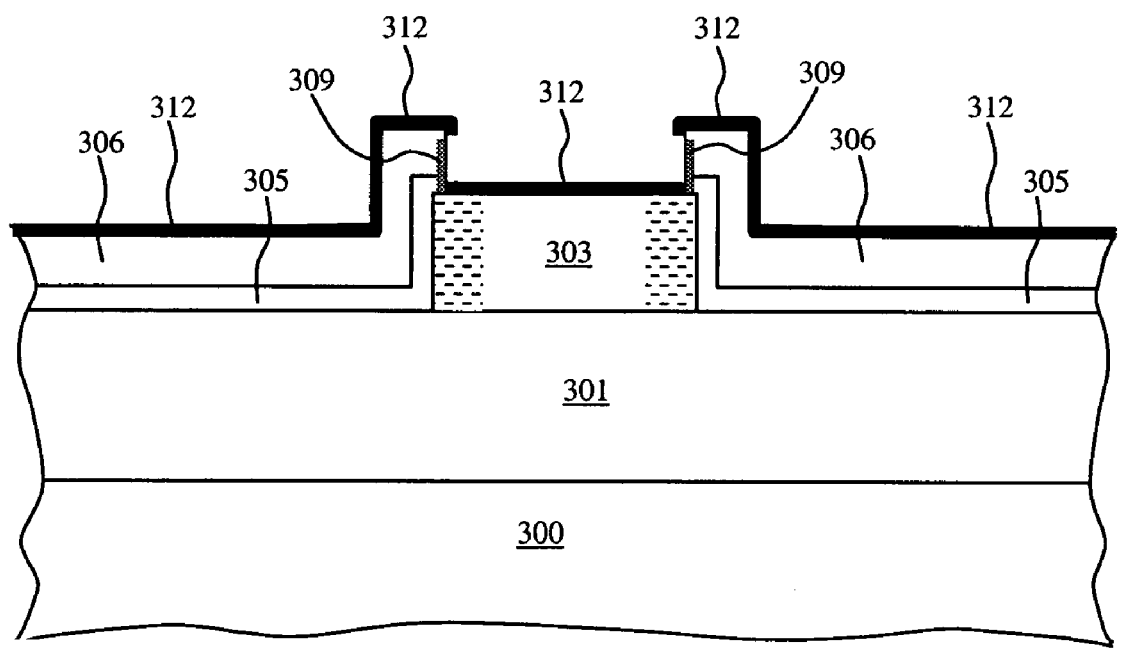
FIG. 10 depicts some alternative self-aligned steps for the design and fabrication process of the SiC transistor of FIG. 9.

If spacer 309 is formed, as described above, the steps leading to formation of the additional spacers 311 may be avoided. The ohmic contact layer (made of metal, polycrystalline, or any other material) is deposited on the top of the structure using blanket deposition as described above. Next, the metal is selectively lifted-off by etching the spacers 309 (not shown), while remaining on the horizontal (in respect to the drawings) surfaces of the gate-contact regions 306 and channel regions 303. Alternatively, salicide regions 312 (FIG. 10) are formed on horizontal SiC surfaces (on the channel regions 303 and on the gate-contact regions 306), while the metal is removed from the spacers 309 where salicide does not form. In either case, with silicide formation or with an additional metal annealing step, this process leads to formation of the ohmic contacts to the channel regions 303 and on the gate-contact regions 306 separated (isolated) from each other by the self-aligned process using a spacer 309.

Figure 9H:
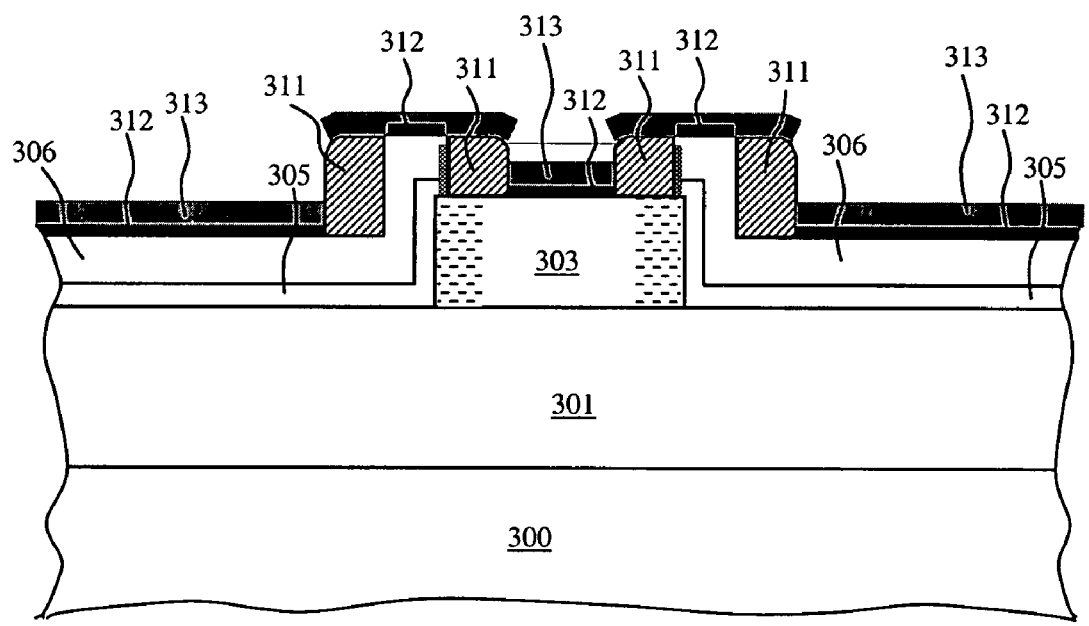

The final metal regions 313 contacting the ohmic contacts may be formed using photolithography (FIG. 9G). Alternatively, the final metal can be formed using anisotropic metal deposition so the metal does not form on the sidewalls of the spacer 311 (FIG. 9H). Additional assurance against the deposition on the sidewalls of the additional spacer 311 may be provided by doing short isotropic etching of additional spacers 311 to achieve undercut of additional spacers 311 under the ohmic metal/silicide (not shown).

The back-side ohmic contact can be formed using any of the known techniques. Another innovative concept involves forming the back-side ohmic contact using low-temperature epitaxial growth of a highly-doped epitaxial layer to reduce the back-side contact resistance, while protecting the entire front side of the wafer with the mask.

Field effect transistor (FET) and static induction transistor (SIT) device regions integrated with Schottky contacts can enhance performance of the Schottky diodes. The fabricating sequence for VJFET and SIT, described above, is suitable for making the merged p-n/Schottky diodes with minor modifications.

The modification to the process is introduced after SiC gate regions 305 and additional SEG SiC gate-contact regions 306 of the same conductivity but of different doping are preferably grown by SEG on the top of the drift region 301 if present or on the surface of the SiC substrate 300 if the drift region 301 is not present and on the sidewalls of the channel regions 303 (as was shown and described in FIG. 9D). In the merged p-n/Schottky device, there is no need to form separate contacts to the gate-contact regions and the channel mesas. For this reason, formation of spacers 309 or additional spacers 311 (FIGS. 9E-9F) is not required. Lateral epitaxial growth during SEG is not essential in this case. After formation of the gate regions 305 and gate-contact regions 306, the entire gate-SEG mask 304 is removed and a Schottky metal layer can be applied covering the channel regions/mesa 303 and the gate-contact regions 306. Alternatively, prior to removing the gate-SEG mask, ohmic contacts (e.g., silicide) can be formed on the gate-contact regions 306. Then the gate-SEG masking layer 304 is removed and a Schottky metal layer is formed on the channel region 303. The same metal will contact the ohmic contacts formed in the previous step.

In another embodiment of the invention, a SiC bipolar junction transistor (BJT) is formed using a self-aligned process (FIGS. 11A-11I). The BJT comprises a SiC substrate 400, an optional low or moderately doped drift region 401, intrinsic base regions 404 of a conductivity different from the drift region 401 and the SiC substrate 400, emitter mesas 405 of a conductivity the same as the drift region 401 and the SiC substrate 400, base-contact region 408 of the same conductivity as the intrinsic base 404 but higher doped than the intrinsic base 404 to form good ohmic contacts, ohmic contacts 409 to the base contact regions 408 and the emitter mesas 405, optional final metal 410 to the base contact regions 408 and the emitter mesas 405, as well as ohmic contacts to the SiC substrate 400. Optional mesa edge termination regions formed by SEG similar to the ones described in previous embodiments can be used.

The optional drift region 401 is formed on the surface of the SiC substrate 400 (FIG. 11A). The drift region 401 can be low or moderately doped epitaxial layer grown on the surface of SiC substrate 400 using regular-temperature epitaxial growth or low-temperature epitaxial growth (LTEG).

Next, the intrinsic base region 404 and emitter mesas 405 are formed. In one embodiment, an intrinsic-base-SEG mask 402 is formed on the top of the drift region 401 if present or on the surface of the SiC substrate 400 if the drift region 401 is not present. The thickness of the intrinsic-base-SEG mask 402 is selected to be close to the planned thickness of the intrinsic base region 404 of the transistor. Preferably, the intrinsic-base-SEG mask 402 is made of deposited nitride. If mesa edge termination regions are used, the intrinsic-base-SEG mask 402 can be prevented from forming (or can be removed for example by etching) in the regions were the mesa edge termination regions are to be formed.

An emitter-SEG mask 403 is formed on the top of the intrinsic-base-SEG mask 402. The thickness of the emitter-SEG mask 403 is normally larger than the thickness of the intrinsic-base-SEG mask 402. Preferably, the thickness of the emitter-SEG mask 403 is selected to be somewhat larger or close to the planned emitter mesas thickness. Preferably, the emitter-SEG mask 403 is made of deposited $SiO_2$ with the thickness in excess of 0.5 μm, although other low- and high-temperature masking materials can be used with thicknesses dictated by the targeted device performance.

Next, the openings (window openings) in the intrinsic-base-SEG mask 402 and the emitter-SEG mask 403 are formed preferably using lithography (FIG. 11A). However, other pattern-defining techniques may suffice. Preferably, the window openings are made simultaneously for the emitter mesas 405 (that will be formed later as shown in FIG. 11C) and for the optional edge termination regions (not shown in the figure). As a result, the window openings expose the surface of the drift region 401 if present or the surface of the SiC substrate 400 if the drift region 401 is not present.

Next, removal of the intrinsic-base-SEG mask 402 under the emitter-SEG mask 403 is conducted (FIG. 11B). Such removal can be accomplished by isotropic selective etching. The etching solution is selected to not etch the emitter-SEG mask 403 or to etch it slower than the intrinsic-base-SEG mask 402. The etching solution attacks the material of the intrinsic-base-SEG mask 402 in the first place at the periphery of the window openings. The etching front gradually penetrates under the emitter-SEG mask 403 the targeted distance with the rate determined by the etching speed and the time of the etching process (FIG. 11B). Precise distance of the under-etch below the emitter-SEG mask 403 is not critical as long as it is sufficiently large to form self-aligned contact of the intrinsic base region 404 with the base contact region 408 in the subsequent processing steps.

Next, intrinsic base regions 404 are formed by SEG on the top of the drift region 401 if present or the surface of the SiC substrate 400 if the drift region 401 is not present in the window openings formed in the intrinsic-base-SEG mask 402 and the emitter-SEG mask 403 (FIG. 11C). Conditions of the SEG process (temperature, pressure, growth rate) are selected to enable growth in the openings under the emitter-SEG mask 403 where a part of the intrinsic-base-SEG mask 402 has been removed. The conductivity of the intrinsic base region 404 is opposite to that of the drift region 401.

Next, emitter mesas 405 of the same conductivity as the drift regions 401 are formed by SEG on the top of the intrinsic base regions 404 in the window openings (FIG. 11C). This process enables growth of the emitter mesas 405 in the same run that was used for intrinsic base region 404 formation without taking the sample from the epitaxial growth reactor, which may be beneficial for the quality of the emitter/base interface. If desirable, however, the emitter mesas 405 and intrinsic base regions 404 can be grown in different growth runs and even in different reactors.

Alternatively, if growth of the emitter mesas 405 and intrinsic base regions 404 does not have to be conducted in the same epitaxial (i.e., SEG) growth run, the process can be simplified (not shown in the figures). The intrinsic-base-SEG mask 402 can be omitted. Prior to forming the emitter-SEG mask 403, the intrinsic base region 404 is preferably grown using epitaxial growth on the surface of the drift region 401 if present or the surface of the SiC substrate 400 if the drift region 401 is not present. The growth can be accomplished using regular-temperature epitaxial growth or low-temperature epitaxial growth (LTEG). Selective epitaxial growth is not required.

Next, emitter mesas 405 of the same conductivity as the drift regions 401 are grown on the top of the intrinsic base layer in the window openings using SEG similar to the description above.

Alternatively, the emitter mesas 405 are formed by performing regular blanket (non-selective) growth and etching (not shown in the figures). First, a SiC emitter layer having the first conductivity type is formed on top of the SiC intrinsic base region. The growth can be done using regular-temperature epitaxial growth or low-temperature epitaxial growth (LTEG). Selective epitaxial growth is not required. Then, an etch-mask (e.g., $SiO_2$ mask) is formed and used for etching to form the emitter mesas. Next, the same etch-mask is subsequently used as a portion of the mask for the subsequent SEG step (i.e., a portion of a base-contact-region-SEG mask 406 covering the top of the emitter mesas 405 as in FIG. 11E as shown and as discussed below). The remaining required portion of the base-contact-region-SEG mask 406 for the subsequent SEG step (i.e., a portion of the base-contact-region-SEG mask 406 covering the sides of the emitter mesas 405) is formed, for example, by one of the methods describe below, for example, by forming a side-wall spacer also as described below.

Further enhancement to the design may be provided by growing the mesa edge termination regions simultaneously with the intrinsic base regions 404 and/or emitter mesas 405 in the same SEG fabrication step. This enhancement only requires providing additional window openings for the SEG in the intrinsic-base-SEG mask 402 and the emitter-SEG mask 403 simultaneously with the emitter mesa window openings in the previous fabrication steps.

Figure 11D:
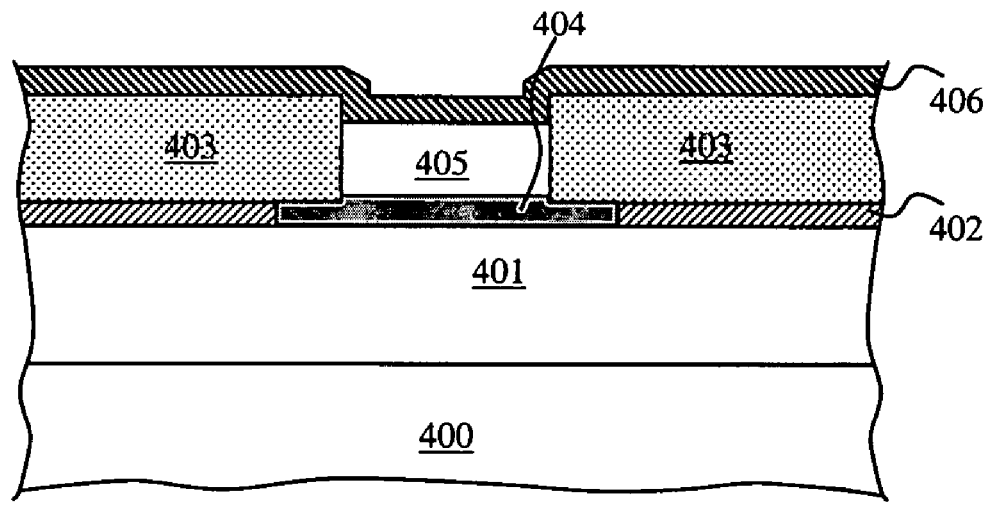

Formation of the portion of the base-contact-region-SEG mask 406 covering the top of the emitter mesas 405 can be accomplished also as follows. After emitter mesas are formed by SEG (as in one of embodiment described above), another masking layer, a base-contact-region-SEG mask 406 (normally thinner than the emitter-SEG mask 403) is formed on the top of the emitter-SEG mask 403 and simultaneously on the top of the emitter mesas 405, as shown in FIG. 11D. The base-contact-region-SEG mask 406 is made preferably of a material different from the emitter-SEG mask 403. Preferably, the material for the base-contact-region-SEG mask 406 can be silicon nitride. However, other materials such as aluminum nitride, graphite, carbon, polycrystalline silicon, and tantalum carbide may be used for the base-contact-region-SEG mask 406 depending on the process considerations.

Figure 11E:
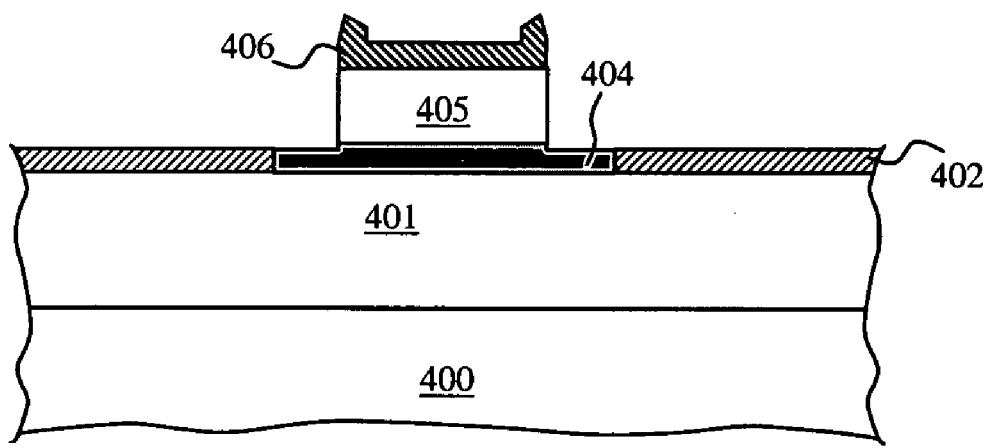

Next, similar to the process used in the VJFET embodiment of the present invention, the portion of the base-contact-region-SEG mask 406 that is located on the emitter-SEG mask 403 is removed. It is preferably removed by lift-off and preferably using selective etching of the underlying emitter-SEG mask 403 (leading to the structure shown in FIG. 11E). If necessary, in order to expose the emitter-SEG mask 403 to etching leading to the lift-off of the base-contact-region-SEG mask 406, openings in the base-contact-region-SEG mask 406 can be etched using photolithography or other techniques, which is not requiring any precise alignment. As a result of the lift-off, the base-contact-region-SEG mask 406 will remain only on the top of the emitter mesas 405, as shown in FIG. 11E (as well as on the top of the optional mesa edge termination regions not shown; the presence of the mask on the top of the optional mesa edge termination regions is irrelevant for further processing and device operation).

Figure 11F:
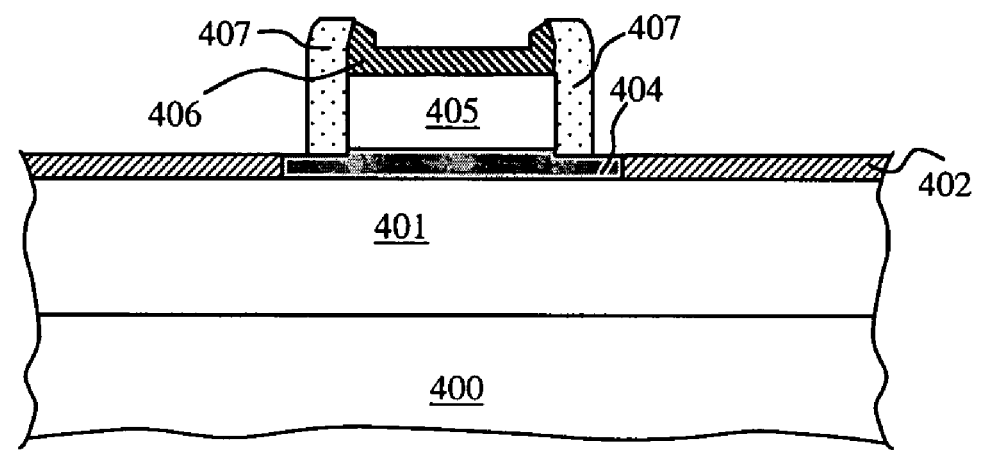

The next step forms one or more additional spacers on the vertical sidewalls of the emitter mesas 405. The emitter-sidewall spacers 407 are formed to serve as a part of the SEG mask for SEG of the base contact regions 408. A masking layer is blanket-deposited on the top of the structure (not shown). The layer can be of $SiO_2$ or nitride materials or any other masking material compatible with SEG. Next, the mask is anisotropically (directionally) etched to expose the horizontal (in respect to the drawing) surfaces of the intrinsic base regions 404. The anisotropic etching results in the vertical sidewalls of the emitter mesas being covered with emitter-sidewall spacers 407 left from the directionally etched masking layer, as shown in FIG. 11F. The directional etching will not expose the top surface of the emitter mesas 405 since in addition to the top masking layer the top surfaces of the emitter mesas 405 were protected by the base-contact-region-SEG mask 406. At this stage, the remaining portions of the intrinsic-base-SEG mask 402 can be removed (for example: (1) by isotropic etch that does not attack the emitter-sidewall spacers 407 and does not attack the base-contact-region-SEG mask 406 on the top of the emitter mesas 405; or (2) by directional etching). Alternatively, the remaining portions of the intrinsic-base SEG mask 402 can be removed prior to forming the emitter-sidewall spacers 407. These variations do not influence the essence of the self-aligned process.

As a result, the surface of the drift region 401 if present or the surface of the SiC substrate 400 if the drift region 401 is not present and the surface of the intrinsic base region 404 outside the emitter mesas 405 will be free from any masking layers, while the sidewalls and the top surfaces of the emitter mesas 405 (i.e. all emitter surfaces) will be covered with either emitter-sidewall spacers 407 or the base-contact-region-SEG mask 406.

Alternatively, similar coverage of all surfaces of the emitter mesas 405 can be achieved without employing the base-contact-region-SEG mask 406 on the top of the emitter mesas 405. After removing the emitter-SEG mask 403 and the remaining intrinsic-base-SEG mask 402, the spacer 407 would be formed as described above. However, if the layer of the emitter-sidewall spacer material blanket-deposited on the top of the structure is thicker on the top of the mesas than at the device surface in-between the mesas (which can be achieved by selecting proper mask deposition conditions), formation of the emitter-sidewall spacers 407 could result in a portion of the masking material remaining on the top of the emitter mesas 405. This can be accomplished as described above, whereby the top mask is anisotropically (directionally) etched to expose the horizontal (in respect to the drawing) surfaces of the intrinsic base regions 404. The anisotropic etching results in the vertical sidewalls of the emitter mesas 405 covered with emitter-sidewall spacers 407 left from the directionally-etched masking layer. If the etching rate and time are controlled within a certain process window opening determined by the relative thicknesses of the masking material on the top of the emitter mesas 405 and on the top of the intrinsic base regions 404, the directional etching will not expose the top surface of the emitter mesas 405 because of the thicker masking later on the top of the mesas.

In any case, any of the proposed variations of the process result in the entire surfaces of the emitter mesas (sidewalls and the top surfaces) covered with the mask (composed of the emitter-sidewall spacers 407 and base-contact-region-SEG mask 406) that can be used as an SEG mask for forming base-contact region 408.

Figure 11G:
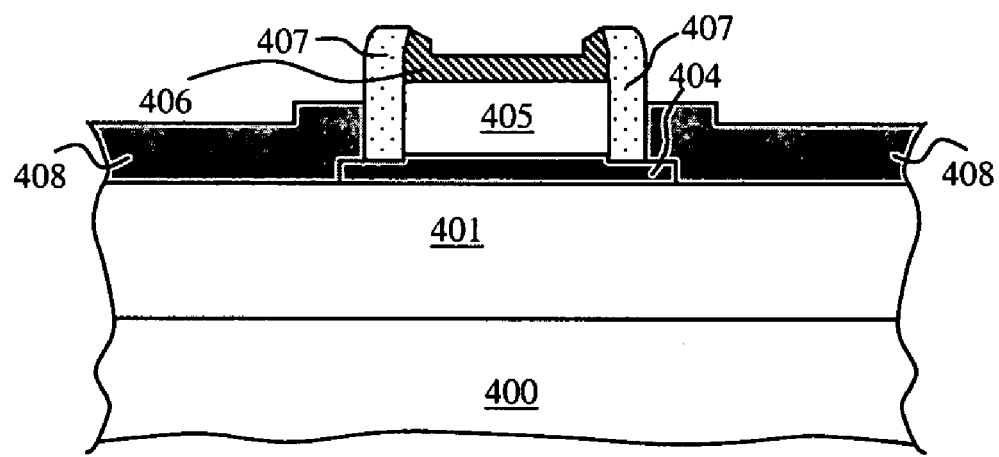

Next, SiC base-contact regions 408 are selectively grown preferably by SEG on the top of the drift region 401 if present or the surface of the SiC substrate 400 if the drift region 401 is not present and on the surface of the intrinsic base regions 404 that are outside of the emitter mesas 405, shown in FIG. 11G. The produced SEG base-contact regions do not contact the emitter mesas 405 since the emitter mesas 405 are covered with the base-contact-region-SEG mask 406 and covered with the emitter-sidewall spacer 407 on the sides. The SiC base-contact regions 408 are doped to achieve the conductivity type the same as that of the intrinsic base region 404 but of doping (conductivity) different from that of the intrinsic base. Preferably, the doping is done during SEG of the base-contact region 408. Preferably, the base-contact regions 408 are higher-doped than the intrinsic base regions 404 to simplify ohmic contact formation and reduce lateral resistance of the base.

Figure 11H:
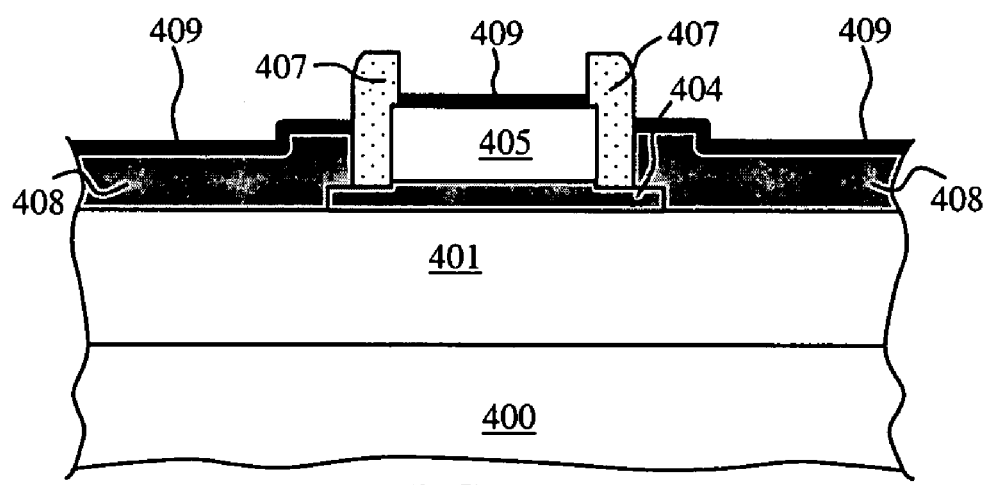

Next, the base-contact-region-SEG mask 406 is removed from the top of the emitter mesas 405 while the emitter-sidewall spacers 407 remain (FIG. 11H). This removal can be accomplished by selective etching not attacking the material of the emitter-sidewall spacers 407, or it can be accomplished by anisotropic etching that would only reduce the height of the emitter-sidewall spacers 407 while completely exposing the SiC surface of the emitter mesas 405.

Next, the contacts to the emitter mesas 405 and to the base-contact regions 408 are formed by a self-aligned technique. The self-aligned technique comprises separating at least one contact layer disposed on an emitter mesa 405 from at least one contact layer disposed on a base-contact region 408 by the entire remaining base-contact-region-SEG mask 406. At this stage, the entire remaining base-contact-region-SEG mask 406 includes the base-contact-region-SEG mask 406 on the top of the emitter mesas 405 and the emitter-sidewall spacers 407.

In the preferred method, an ohmic contact layer (made of metal, semiconductor, or any other material) is deposited on the top of the structure preferably using blanket deposition. Next, the metal is selectively lifted-off by etching the emitter-sidewall spacers 407 (not shown), while remaining on the base-contact regions 408 and on the top of the emitter mesas 405. Alternatively, salicide regions 409, as shown in FIG. 11H, are formed on SiC surfaces (at least on the extrinsic base and the emitter mesa 405 tops), while the metal is removed from the emitter-sidewall spacers 407 where salicide does not form (FIG. 11H). In any case, with silicide formation or with an additional metal annealing step, this process leads to formation of the ohmic contacts 409 to the base-contact regions 408 and to the emitter mesa 405 tops, with ohmic contacts separated (isolated) from each other by spacers 407. Ohmic contacts 409 may comprise a single layer or a plurality of layers.

Figure 11I:
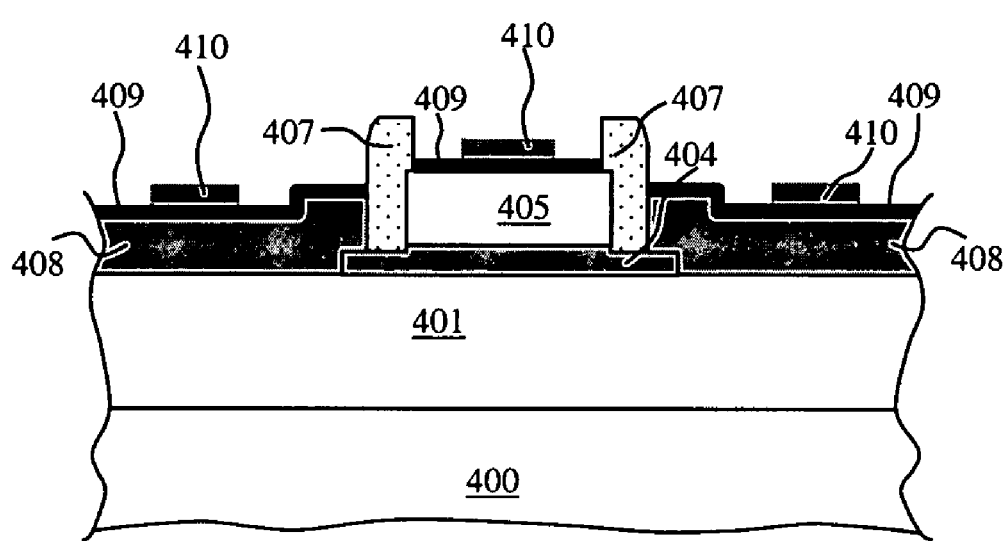
Figure 11J:
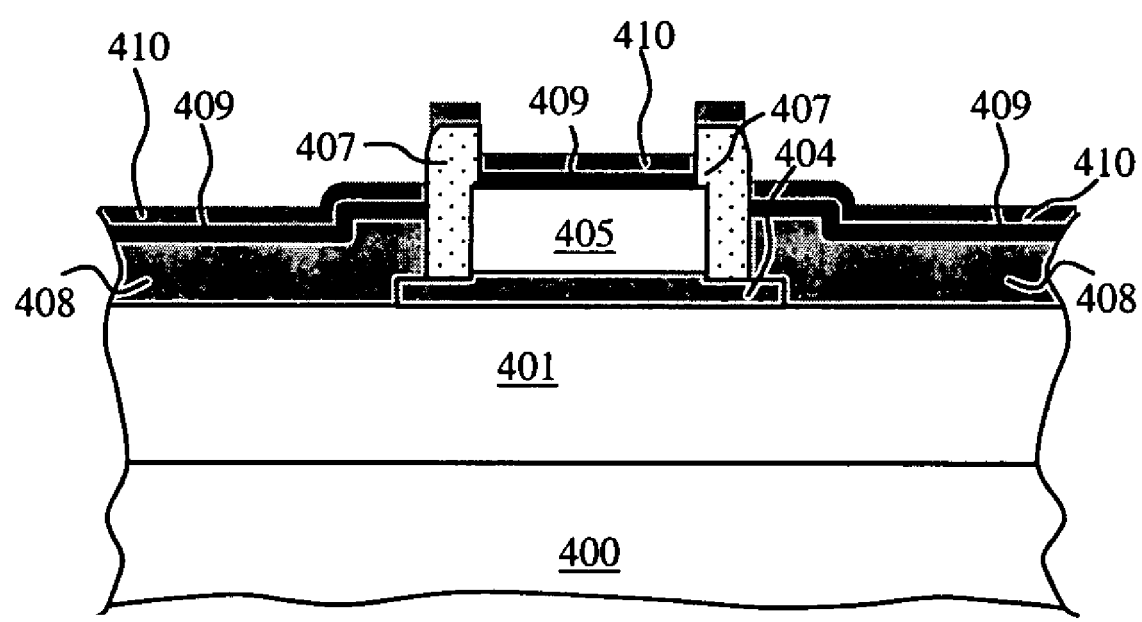

The final metal 410 contacting the ohmic contacts may be formed preferably using photolithography (FIG. 11I). Alternatively, the final metal 410 can be formed using anisotropic metal deposition so the metal does not form on the sidewalls of the spacer 407 (FIG. 11J).

The back-side ohmic contact can be formed using any of the known techniques. Another innovative concept involves forming the back-side ohmic contact using low-temperature epitaxial growth of a highly-doped epitaxial layer to reduce the back-side contact resistance, while protecting the entire front side of the wafer with the mask.

In each of the embodiments, the ohmic contact formation is preferably performed by silicide formation. Also, ohmic contact annealing can be done at any stage of the device fabrication process, but prior to the region formations that could suffer from the high temperature of the ohmic contact anneal (e.g., Schottky contact can suffer from the high temperature of the ohmic contact formation).

It is to be appreciated that the broadest scope of this invention includes such modifications as additional or different interactions and materials. For example, other conducting materials such as poly-Si can be used instead of metals, when appropriate. Many other advantages of the invention will be apparent to those skilled in the art from the above descriptions and the below claims.

It is also to be appreciated from the foregoing descriptions of multiple embodiments of the present invention that various alterations, variations, modifications, and improvements will be readily apparent to those skilled in the art. The specific embodiments of the present invention have been described herein for purposes of illustration and the terminology used for the descriptions should not be regarded as limiting. Such alterations, variations, modifications, and improvements are intended to be part of this disclosure and may be made without deviating from and are intended to be within the spirit and scope of the invention.

What is claimed is:
1. A method of making a semiconductor device, the method comprising:

forming a selective epitaxial growth SEG mask on the surface of a SiC substrate;

forming at least one window opening in the SEG mask to expose the surface of the SiC substrate;

forming at least one SEG mesa having at least a top, a bottom, and sidewalls in the window opening in the SEG mask and disposed on the SiC substrate by selective epitaxial growth; and forming at least one device region by a self-aligned technique comprising forming at least one contact, wherein forming the at least one contact comprises forming a self-aligned silicide using a portion of the SEG mask as a mask for the self-aligned silicide formation;

wherein the at least one SEG mesa comprises at least one SiC layer of selected conductivity type, doping level, and doping depth distribution and wherein the selective epitaxial growth is by halo-carbon low-temperature epitaxial growth.

2. The method of claim 1, wherein forming at least one window opening in the SEG mask to expose the surface of the SiC substrate comprises:

selectively removing the SEG mask to form at least one window opening in the SEG mask; and optionally removing to a selected depth a portion of the SiC substrate in the window opening, thereby forming at least one trench in the exposed surface of the SiC substrate prior to forming the SEG mesa.

3. The method of claim 1, wherein one or more portions of the SEG mesa near the sidewalls are doped with dopant species during selective epitaxial growth to obtain a doping level different from the doping level of the SEG mesa and wherein said doping is by release of dopant species from an intentionally-doped SEG mask and by incorporation of the released dopant species into one or more regions of the SEG mesa near the SEG mask.

4. The method of claim 1, wherein the thickness of the SEG mask is less than the selected thickness of the SEG mesa and wherein the selective epitaxial growth comprises lateral epitaxial growth above the SEG mask.

5. The method of claim 1, wherein the selective epitaxial growth forms at least one highly-doped SiC ohmic contact region.

6. A silicon carbide device made by the method of claim 1.

7. A method of making a semiconductor device, the method comprising:

forming a selective epitaxial growth SEG mask on the surface of a SiC substrate;

forming at least one window opening in the SEG mask to expose the surface of the SiC substrate;

forming at least one SEG mesa having at least a top, a bottom, and sidewalls in the window opening in the SEG mask and disposed on the SiC substrate by selective epitaxial growth; and forming at least one device region by a self-aligned technique comprising forming at least one contact, wherein forming the at least one contact comprises forming at least one metal layer using a portion of the SEG mask as a mask for defining the dimensions of the metal layer;

wherein the at least one SEG mesa comprises at least one SiC layer of selected conductivity type, doping level, and doping depth distribution and wherein the selective epitaxial growth is by halo-carbon low-temperature epitaxial growth.

8. The method of claim 7, wherein the semiconductor device is a silicon carbide p-n junction diode comprising a SiC substrate of a first conductivity type, optionally a SiC drift region of the first conductivity type disposed on the SiC substrate, at least one SiC mesa comprising a bottom SiC layer of the first conductivity type disposed on the SiC substrate or drift region and a top SiC emitter layer of a second conductivity type disposed on the bottom SiC layer, and at least one contact disposed at least on the top SiC emitter layer and on the SiC substrate, the method comprising:

optionally forming a drift region on the SiC substrate;

forming at least one SEG mask on the SiC substrate or the drift region wherein the SEG mask has window openings exposing the surface of the SiC substrate or the drift region;

forming by selective epitaxial growth a bottom SiC layer of the first conductivity type in the SEG mask window openings and disposed on the SiC substrate or the drift region;

forming by selective epitaxial growth a top SiC emitter layer of the second conductivity type in the SEG mask window openings and disposed on the bottom SiC layer; and forming at least one contact on at least the top SiC emitter layer and the SiC substrate.

9. A silicon carbide p-n junction diode made by the method of claim 8.

10. The method of claim 7, wherein the semiconductor device is a silicon carbide diode comprising a SiC substrate of a first conductivity type, optionally a SiC drift region of the first conductivity type disposed on the SiC substrate, at least one SiC emitter mesa formed by selective epitaxial growth, optionally a plurality of mesa edge termination regions, and at least one contact disposed on at least the emitter mesa and on the SiC substrate, the method comprising:

optionally forming a drift region disposed on the SiC substrate;

forming at least one SEG mask having at least one window opening and disposed on the SiC substrate or drift region, wherein the window opening exposes the surface of the SiC substrate or drift region;

optionally removing to a selected depth a portion of the SiC substrate or drift region in the window opening, thereby forming at least one trench in the exposed surface of the SiC substrate or drift region;

forming by selective epitaxial growth at least one SiC emitter mesa in at least one of the SEG mask window openings and disposed on the SiC substrate or drift region;

optionally forming by selective epitaxial growth simultaneously with the formation of the SiC emitter mesa a plurality of mesa edge termination regions in at least one other SEG mask window opening and disposed on the SiC substrate or drift region; and forming at least one contact on at least the emitter mesa and the SiC substrate.

11. A silicon carbide p-n junction diode made by the method of claim 10.

12. The method of claim 7, wherein the semiconductor device is a silicon carbide diode comprising a SiC substrate of a first conductivity type, optionally a SiC drift region of the first conductivity type disposed on the SiC substrate, at least one Schottky contact layer, a plurality of mesa edge termination regions, and at least one ohmic contact disposed on at least the SiC substrate, the method comprising:

optionally forming a drift region disposed on the SiC substrate;

forming at least one SEG mask having a plurality of window openings and disposed on the SiC substrate or drift region, wherein at least one window opening of the plurality of window openings exposes a first portion of the surface of the SiC substrate or drift region;

optionally removing to a selected depth a portion of the SiC substrate or drift region in the at least one window opening of the plurality of window openings, thereby forming at least one trench in the exposed first portion of the surface of the SiC substrate or drift region;

forming by selective epitaxial growth a plurality of mesa edge termination regions in the plurality of SEG mask window openings and disposed on the SiC substrate or drift region;

removing the SEG mask, thereby exposing a second portion of the surface of the SiC substrate or drift region;

forming the at least one Schottky contact layer on the exposed second portion of the surface of the SiC substrate or drift region, wherein the Schottky contact layer is in contact with two adjacent mesa edge termination regions; and forming ohmic contacts on at least the SiC substrate.

13. A silicon carbide Schottky diode made by the method of claim 12.

14. The method of claim 7, wherein the semiconductor device is a silicon carbide diode, comprising a SiC substrate of a first conductivity type, optionally a drift region of the first conductivity type disposed on the SiC substrate, a plurality of SiC emitter mesas of a second conductivity type formed by selective epitaxial growth, optionally a plurality of mesa edge termination regions of the second conductivity type formed by selective epitaxial growth, at least one Schottky contact layer disposed on the SiC substrate or drift region, and at least one ohmic contact disposed on at least the plurality of emitter mesas and on the SiC substrate, the method comprising:

optionally forming a drift region of a first conductivity type disposed on the SiC substrate;

forming a SEG mask having a plurality of window openings and disposed on the SiC substrate or drift region, wherein the plurality of window openings exposes the surface of the SiC substrate or drift region;

optionally removing to a selected depth a portion of the SiC substrate or drift region in at least one window opening of the plurality of window openings of the SEG mask, thereby forming at least one trench in the exposed surface of the SiC substrate or drift region;

forming by selective epitaxial growth a plurality of SiC emitter mesas in a first group of the plurality of the SEG mask window openings and disposed on the SiC substrate or drift region and optionally forming a plurality of mesa edge termination regions in a second group of the plurality of SEG mask window openings and disposed on the SiC substrate or drift region;

optionally forming at least one ohmic contact on at least one emitter mesa of the plurality of SiC emitter mesas;

removing the SEG mask;

forming at least one Schottky contact layer on the SiC substrate or drift region between at least two SiC emitter mesas of the plurality of SiC emitter mesas, wherein the Schottky contact layer optionally covers a portion of the at least two SiC emitter mesas of the plurality of SiC emitter mesas; and forming at least one ohmic contact on at least the SiC substrate.

15. A silicon carbide diode made by the method of claim 14.

16. A method of making a semiconductor device, the method comprising:

forming a selective epitaxial growth SEG mask on the surface of a SiC substrate;

forming at least one window opening in the SEG mask to expose the surface of the SiC substrate;

forming at least one SEG mesa having at least a top, a bottom, and sidewalls in the window opening in the SEG mask and disposed on the SiC substrate by selective epitaxial growth; and forming at least one device region by a self-aligned technique;

wherein the at least one SEG mesa is formed by a self-aligned technique and is aligned to at least one other mesa having sidewalls, wherein the alignment of the SEG mesa to the other mesa comprises selective epitaxial growth of the SEG mesa using a sidewall spacer formed on the sidewalls of the other mesa to separate the sidewalls of the SEG mesa from the sidewalls of the other mesa; and wherein the at least one SEG mesa comprises at least one SiC layer of selected conductivity type, doping level, and doping depth distribution and wherein the selective epitaxial growth is by halo-carbon low-temperature epitaxial growth.

17. A method of making a semiconductor device, the method comprising:

forming a selective epitaxial growth SEG mask on the surface of a SiC substrate;

forming at least one window opening in the SEG mask to expose the surface of the SiC substrate;

forming at least one SEG mesa having at least a top, a bottom, and sidewalls in the window opening in the SEG mask and disposed on the SiC substrate by selective epitaxial growth; and forming at least one device region by a self-aligned technique;

wherein formation of the SEG mask for forming the SEG mesa is by a self-aligned technique and comprises at least one main SEG masking layer and at least one additional first SEG masking layer, wherein the self-aligned technique comprises:

forming the at least one additional first SEG masking layer;

forming the at least one main SEG masking layer on top of the additional first SEG masking layer;

forming at least one window opening in the main SEG masking layer and the additional masking layer to expose the surface of the SiC substrate; and selectively removing at least a portion of the additional first SEG masking layer below the main SEG masking layer at the periphery of the window opening without removing the main SEG masking layer above the removed portion of the additional first SEG masking layer, thereby enabling selective epitaxial growth in the window opening and under the main SEG masking layer at the window periphery where the portion of the additional first SEG masking layer was removed; and wherein the at least one SEG mesa comprises at least one SiC layer of selected conductivity type, doping level, and doping depth distribution and wherein the selective epitaxial growth is by halo-carbon low-temperature epitaxial growth.

18. A method of making a semiconductor device, the method comprising:

forming a selective epitaxial growth SEG mask on the surface of a SiC substrate;

forming at least one window opening in the SEG mask to expose the surface of the SiC substrate;

forming at least one SEG mesa having at least a top, a bottom, and sidewalls in the window opening in the SEG mask and disposed on the SiC substrate by selective epitaxial growth; and forming at least one device region by a self-aligned technique;
wherein forming the SEG mask for forming the at least one SEG mesa is by a self-aligned technique and comprises at least a first and a second SEG masking layer, wherein the self-aligned technique comprises:
forming at least one window opening in the first SEG masking layer to expose the surface of the SiC substrate;
forming the second SEG masking layer on top of the first SEG masking layer;
removing the second SEG masking layer selectively to expose the surface of the SiC substrate in selected window openings;
forming at least one SEG mesa on the exposed surface of the SiC substrate in selected window openings by selective epitaxial growth;
removing selected portions of the second SEG masking layer to expose the surface of the SiC substrate in at least one of the window openings previously masked by the second SEG masking layer; and
forming at least one additional SEG mesa on the exposed surface of the SiC substrate in the at least one of the window openings previously masked by the second SEG masking layer by selective epitaxial growth; and
wherein the at least one SEG mesa comprises at least one SiC layer of selected conductivity type, doping level, and doping depth distribution and wherein the selective epitaxial growth is by halo-carbon low-temperature epitaxial growth.

19. The method of claim 18, wherein the semiconductor device is a silicon carbide diode, comprising a SiC substrate of a first conductivity type, optionally a SiC drift region of the first conductivity type disposed on the SiC substrate, at least one SiC emitter mesa comprising at least a first layer and a second layer of different doping levels formed by selective epitaxial growth, optionally a plurality of mesa edge termination regions formed by selective epitaxial growth having the same conductivity type as one of the first layer or second layer of different doping levels of the SiC emitter mesa, and ohmic contacts disposed at least on the emitter mesa and on the SiC substrate, the method comprising:
optionally forming a drift region on the SiC substrate;
forming a first SEG mask having a plurality of window openings and disposed on the SiC substrate or drift region, wherein the plurality of the window openings exposes the surface of the SiC substrate or drift region;
optionally removing to a selected depth a portion of the SiC substrate or drift region in at least one window opening of the plurality of window openings in the first SEG mask, thereby forming at least one trench in the exposed surface of the SiC substrate or drift region;
forming a second SEG mask disposed on the first SEG mask, wherein the second SEG mask covers the exposed surface of the SiC substrate or drift region in a first group of the plurality of window openings and does not cover the exposed surface of the SiC substrate or drift region in a second group of the plurality of window openings;
forming by selective epitaxial growth on the exposed surface of the SiC substrate or drift region in the second group of the plurality of window openings a first layer of the SiC emitter mesa having a selected doping level;
removing at least a portion of the second SEG mask covering the surface of the SiC substrate or drift region in the first group of the plurality of window openings;
forming by selective epitaxial growth a second layer of the SiC emitter mesa having doping different from the doping of the first layer of the SiC emitter mesa and disposed on the first layer of the SiC emitter mesa in the second group of the plurality of window openings, and simultaneously forming at least one mesa edge termination region having doping different from the doping of the first layer of the SiC emitter mesa and disposed on the surface of the SiC substrate or drift region in the first group of the plurality of window openings; and
forming at least one ohmic contact on at least the SiC emitter mesa and the SiC substrate.

20. A silicon carbide diode made by the method of claim 19.

21. A method of making a semiconductor device, the method comprising:
forming a selective epitaxial growth SEG mask on the surface of a SiC substrate;
forming at least one window opening in the SEG mask to expose the surface of the SiC substrate;
forming at least one SEG mesa having at least a top, a bottom, and sidewalls in the window opening in the SEG mask and disposed on the SiC substrate by selective epitaxial growth; and
forming at least one device region by a self-aligned technique;
wherein the at least one SEG mesa is formed by a self-aligned technique and is aligned to at least one other mesa, wherein the alignment of the SEG mesa to the other mesa comprises selective epitaxial growth of the SEG mesa using the SEG mask placed on top of the other mesa to prohibit growth on the top of the other mesa during selective epitaxial growth of the SEG mesa; and
wherein the at least one SEG mesa comprises at least one SiC layer of selected conductivity type, doping level, and doping depth distribution and wherein the selective epitaxial growth is by halo-carbon low-temperature epitaxial growth.

22. The method of claim 21, wherein forming the at least one other mesa comprises selective epitaxial growth using a first SEG mask, and forming the other mesa and forming the SEG mask on top of the other mesa comprises:
forming the other mesa by selective epitaxial growth using a first SEG mask;
forming a second masking layer prior to removing the first SEG mask, thereby covering at least the top of the one other mesa and at least a portion of the first SEG mask with the second masking layer; and
removing the first SEG mask and the second masking layer selectively from where the second masking layer is positioned at the top of the first SEG mask, thereby retaining the second masking layer on top of the other mesa and thereby forming the SEG mask placed on top of the other mesa.

23. The method of claim 21, wherein forming the at least one other mesa comprises using an etch mask, and forming the at least one other mesa and forming the SEG mask placed on top of the at least one other mesa comprises:
forming a first SiC layer;
forming an etch mask disposed on the first SiC layer and covering a portion of the first SiC layer, thereby having a portion of the first SiC layer not covered with the etch mask;
removing the portion of the first SiC layer not covered with the etch mask, while keeping the portion of the SiC layer covered with the etch mask, thereby forming the other mesa covered with the etch mask; and
retaining the etch mask for later use as the SEG mask on top of the other mesa.

24. The method of claim 21, wherein the self-aligned technique comprises:

forming at least one portion of the SEG mesa by lateral epitaxial growth, thereby forming at least one additional mesa sidewall on the at least one portion of the other mesa; and forming at least one sidewall spacer on the additional mesa sidewall.

25. The method of claim 21, wherein the semiconductor device is a silicon carbide transistor, comprising a SiC substrate of a first conductivity type, optionally a SiC drift region of the first conductivity type disposed on the SiC substrate, at least one SiC channel mesa having a portion thereof of the first conductivity type, at least one SiC gate region having a portion thereof of a second conductivity type, optionally a SiC gate-contact region of the second conductivity type, and at least one contact disposed at least on the SiC channel mesa and on the SiC substrate and disposed on the SiC gate-contact region or on the SiC gate region, the method comprising:

optionally forming a drift region of a first conductivity type on the SiC substrate;

forming at least one SiC channel mesa having at least a top surface and sidewalls and having at least a portion thereof of the first conductivity type and disposed on the SiC substrate or drift region and having at least one gate-SEG mask disposed on the top surface of the SiC channel mesa; and forming by selective epitaxial growth at least one SiC gate region having a portion thereof of the second conductivity type and disposed on the SiC substrate or drift region and on the sidewalls of the SiC channel mesa;

wherein the at least one gate-SEG mask is used to prohibit epitaxial growth on the top surface of the SiC channel mesa.

26. The method of claim 25, wherein forming the at least one SiC channel mesa comprises:

forming at least one channel-SEG mask having at least one window opening and disposed on the SiC substrate or drift region, wherein the window opening exposes the surface of the SiC substrate or drift region;

optionally removing to a selected depth a portion of the SiC substrate or drift region in the channel-SEG mask window opening, thereby forming at least one trench in the exposed surface of the SiC substrate or drift region; and forming by selective epitaxial growth at least one SiC channel mesa in the channel-SEG mask window opening.

27. The method of claim 25, wherein forming the at least one SiC channel mesa comprises:

forming a SiC channel layer having the first conductivity type and disposed on the SiC substrate or drift region;

forming a channel-SEG mask disposed on the SiC channel layer, wherein the channel-SEG mask covers at least one selected region of the surface of the SiC channel layer; and selectively removing a portion of the non-covered region of the surface of the SiC channel layer to a desirable depth using the channel-SEG mask as an etch mask, thereby forming at least one SiC channel mesa having the channel-SEG mask disposed on top of the SiC channel mesa.

28. A silicon carbide transistor made by the method of claim 25.

29. The method of claim 25, further comprising:

optionally forming by selective epitaxial growth at least one SiC gate-contact region of the second conductivity type of a doping level higher than the doping level of the SiC gate region, wherein the SiC gate-contact region has a selected thickness and at least one vertical sidewall and is disposed on the SiC gate region; and forming at least one contact disposed at least on the SiC channel mesa and on the SiC substrate and disposed on the SiC gate-contact region or the SiC gate region.

30. The method of claim 29, wherein at least one of the vertical sidewalls of the SiC gate-contact region is formed above the gate-SEG mask on the top of the SiC channel mesa, the method of forming the at least one of the vertical sidewalls of the SiC gate-contact region and at least one contact comprising:

forming by lateral epitaxial growth during selective epitaxial growth a final portion of the SiC gate-contact region that covers a portion of the top of the gate-SEG mask above the SiC channel region;

forming at least one sidewall spacer disposed on the at least one vertical sidewall of the SiC gate-contact region;

removing the portion of the gate-SEG mask not covered by the final portion of the SiC gate-contact region, thereby exposing the top of the SiC channel mesa; and forming at least one contact on the SiC channel mesa and at least one contact on the gate-contact region, wherein the contacts are ohmic and the contact on the SiC channel mesa is separated from the contact on the gate-contact region by the sidewall spacer.

31. The method of claim 29, wherein forming at least one contact on the at least one SiC gate-contact region and the at least one SiC channel mesa comprises removing the gate-SEG mask disposed on the SiC channel mesa and SiC gate-contact region and forming at least one metal layer covering the channel mesa and gate-contact region, wherein the metal layer forms at least one Schottky contact on the SiC channel mesa and at least one ohmic contact on the SiC gate-contact region.

32. The method of claim 31, wherein forming at least one Schottky contact on the SiC channel mesa and at least one ohmic contact on the SiC gate-contact region comprises:

forming a first metal layer on the SiC channel mesa after forming by selective epitaxial growth at least one SiC gate-contact region, wherein the first metal layer forms an ohmic contact on the SiC gate-contact region;

removing the gate-SEG mask; and forming a second metal layer covering the SiC channel mesa and the first metal layer, wherein the second metal layer forms at least one Schottky contact on the SiC channel mesa.

33. A silicon carbide diode utilizing Schottky junctions and p-n junctions made by the method of claim 31.

34. The method of claim 21, wherein the semiconductor device is a silicon carbide bipolar junction transistor, comprising a SiC substrate of a first conductivity type, optionally a SiC drift region of the first conductivity type disposed on the SiC substrate, at least one SiC intrinsic base region of a second conductivity type, at least one SiC emitter mesa of the first conductivity type, at least one SiC base-contact region of the second conductivity type, optionally a plurality of SiC mesa edge termination regions, and a plurality of contacts disposed at least on the SiC emitter mesa, on the SiC base-contact region, and on the SiC substrate, the method comprising:

optionally forming a drift region of a first conductivity type on the substrate layer;

forming at least one intrinsic base region of a second conductivity type disposed on the SiC substrate or drift region;

forming at least one emitter mesa having vertical sidewalls of the first conductivity type disposed on the intrinsic base region;

forming a base-contact-region-SEG mask covering at least one selected portion of the SiC emitter mesa;

forming by selective epitaxial growth at least one base-contact region of the second conductivity type, wherein the base-contact-region-SEG mask is used as the mask for selective epitaxial growth and the base-contact region is in contact with at least one selected portion of the intrinsic base region; and forming a plurality of contacts on at least the SiC emitter mesa, on the SiC base-contact region, and on the SiC substrate.

35. The method of claim 34, wherein forming the at least one emitter mesa comprises:

forming an emitter-SEG mask having at least one window opening exposing a selected portion of the surface of the intrinsic base region and disposed at least on the intrinsic base region; and forming by selective epitaxial growth at least one emitter mesa of the first conductivity type having vertical sidewalls in the emitter-SEG mask window opening and disposed on the selected portion of the surface of the intrinsic base region.

36. The method of claim 34, wherein forming the at least one intrinsic base region and the at least one emitter mesa comprises:

forming a two-layered masking layer comprising an intrinsic-base-SEG mask disposed on the SiC substrate or drift region and an emitter-SEG mask comprising a top and bottom surface disposed on the intrinsic-base-SEG mask;

forming at least one window opening in the two-layered masking layer exposing the surface of the SiC substrate or drift region;

removing a selected portion of the intrinsic-base-SEG mask at the periphery of the window openings below the bottom surface of the emitter-SEG mask;

forming by selective epitaxial growth the intrinsic base region in the window openings of the two-layered masking layer disposed on the exposed surface of the SiC substrate or drift region in the window openings of the two-layered masking layer and at the periphery of the window openings below the bottom surface of the emitter-SEG mask where the selected portion of the intrinsic-base-SEG mask was removed; and forming by selective epitaxial growth the at least one emitter mesa in the window openings of the two-layered masking layer and disposed on a portion of the intrinsic base region.

37. The method of claim 34, wherein forming the base-contact-region-SEG mask comprises forming emitter-sidewall spacers on the vertical sidewalls of the emitter mesa and thereby forming a portion of the base-contact-region-SEG mask covering at least the vertical sidewalls of the emitter and not covering at least a portion of the intrinsic base region.

38. The method of claim 34, wherein forming the at least one contact on the at least one emitter mesa and on the at least one base-contact region comprises forming at least one first contact layer disposed on the emitter mesa and at least one second contact layer disposed on the base-contact region by a self-aligned technique, the self-aligned technique comprising the step of separating the first contact layer disposed on the emitter mesa from the second contact layer disposed on the base-contact region by at least one portion of the base-contact-region-SEG mask.

39. A silicon carbide bipolar junction transistor made by the method of claim 34.

40. The method of claim 34, wherein forming the at least one emitter mesa and the base-contact-region-SEG mask covering at least one selected portion of the SiC emitter mesa comprises:

forming an emitter-SEG mask having at least one window opening exposing a selected portion of the intrinsic base region and disposed at least on the intrinsic base region;

forming by selective epitaxial growth at least one emitter mesa of the first conductivity type having vertical sidewalls in the emitter-SEG mask window opening and disposed on the intrinsic base region;

forming an additional masking layer on the emitter-SEG mask and on the emitter mesa; and removing the emitter-SEG mask, thereby removing the portion of the additional masking layer disposed on the emitter-SEG mask and retaining only the portion of the additional masking layer disposed on the emitter mesa and thereby creating the base-contact-region-SEG mask disposed on the emitter mesa.

41. The method of claim 34, wherein forming the at least one SiC emitter mesa and the base-contact-region-SEG mask covering at least one selected portion of the SiC emitter mesa comprises:

forming a SiC emitter layer having the first conductivity type and disposed at least on the SiC intrinsic base region;

forming the base-contact-region-SEG mask disposed on the SiC emitter layer, wherein the base-contact-region-SEG mask covers at least one selected portion of the SiC emitter layer; and selectively removing the portion of the SiC emitter layer not covered with the base-contact-region-SEG mask using the base-contact-region-SEG mask as an etch-mask to expose the SiC intrinsic base region, thereby forming the SiC emitter mesa having the base-contact-region-SEG mask disposed on the SiC emitter mesa.

* * * * *